(12) United States Patent
Yamakawa et al.

(10) Patent No.: US 10,420,183 B2
(45) Date of Patent: Sep. 17, 2019

(54) WHITE LIGHT SOURCE AND WHITE LIGHT SOURCE SYSTEM

(71) Applicants: KABUSHIKI KAISHA TOSHIBA, Tokyo (JP); TOSHIBA MATERIALS CO., LTD., Yokohama-Shi (JP)

(72) Inventors: Masahiko Yamakawa, Yokohama (JP); Noriaki Yagi, Yokohama (JP); Kumpei Kobayashi, Yokohama (JP)

(73) Assignees: Kabushiki Kaisha Toshiba, Minato-Ku (JP); Toshiba Materials Co., Ltd., Yokohama-Shi (JP)

( * ) Notice: Subject to any disclaimer, the term of this patent is extended or adjusted under 35 U.S.C. 154(b) by 0 days.

(21) Appl. No.: 15/493,556

(22) Filed: Apr. 21, 2017

(65) Prior Publication Data

US 2017/0238390 A1    Aug. 17, 2017

Related U.S. Application Data

(63) Continuation of application No. PCT/JP2015/005418, filed on Oct. 28, 2015.

(30) Foreign Application Priority Data

Oct. 28, 2014    (JP) .................................. 2014-219532

(51) Int. Cl.
*H05B 33/08*        (2006.01)
*H05B 37/02*        (2006.01)
(Continued)

(52) U.S. Cl.
CPC ........... *H05B 33/0857* (2013.01); *F21K 9/64* (2016.08); *F21S 2/00* (2013.01); *F21S 8/006* (2013.01);
(Continued)

(58) Field of Classification Search
CPC .... H05B 33/08; H05B 33/0857; H05B 37/02; H05B 37/0281; F21K 9/64; F21S 8/006
See application file for complete search history.

(56) References Cited

U.S. PATENT DOCUMENTS

2006/0226759 A1    10/2006    Masuda et al.
2009/0251057 A1    10/2009    Son et al.
(Continued)

FOREIGN PATENT DOCUMENTS

EP    2 674 662 A1    12/2013
EP    2 701 213 A1    2/2014
(Continued)

OTHER PUBLICATIONS

International Search Report and Written Opinion (Application No. PCT/JP2015/005418) dated Feb. 2, 2016.
(Continued)

*Primary Examiner* — Thai Pham
(74) *Attorney, Agent, or Firm* — Burr & Brown, PLLC

(57) ABSTRACT

There is provided a white light source approximating sunlight and being capable of reproducing a subtle difference in sunlight which changes depending on times and locations, and provided a white light source system of a lighting system or the like. The white light source includes a light source unit. Light which is emitted from the light source unit is a chromaticity point on a CIE chromaticity diagram and has a correlated color temperature corresponding to a chromaticity point including a deviation of −0.005 or more to +0.005 or less with respect to a black body radiation locus, and satisfies a formula: $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$.

18 Claims, 17 Drawing Sheets

(51) Int. Cl.
*F21K 9/64* (2016.01)
*F21S 8/00* (2006.01)
*F21S 2/00* (2016.01)
*H01L 33/50* (2010.01)
*F21Y 115/10* (2016.01)
*F21W 131/405* (2006.01)

(52) U.S. Cl.
CPC ........... *H01L 33/504* (2013.01); *H05B 37/02* (2013.01); *H05B 37/0281* (2013.01); *F21W 2131/405* (2013.01); *F21Y 2115/10* (2016.08)

(56) References Cited

U.S. PATENT DOCUMENTS

| | | | | |
|---|---|---|---|---|
| 2010/0295464 | A1* | 11/2010 | Kasakura | H01L 25/0753 315/287 |
| 2012/0326627 | A1 | 12/2012 | McDaniel, Jr. | |
| 2014/0036499 | A1 | 2/2014 | Yamakawa et al. | |
| 2014/0111985 | A1 | 4/2014 | Harbers | |
| 2014/0284636 | A1* | 9/2014 | Yamakawa | C09K 11/7734 257/88 |
| 2015/0380460 | A1* | 12/2015 | Horie | H05B 33/086 257/89 |

FOREIGN PATENT DOCUMENTS

| | | | | |
|---|---|---|---|---|
| EP | 2 772 953 | A1 | 9/2014 | |
| JP | 2005-086051 | A1 | 3/2005 | |
| JP | 2005086051 | A * | 3/2005 | |
| JP | 2009-540599 | A1 | 11/2009 | |
| JP | 2011-023339 | A1 | 2/2011 | |
| JP | WO 2013061942 | A1 * | 5/2013 | ......... C09K 11/7734 |
| JP | 2014-197536 | A1 | 10/2014 | |
| WO | 2009/063915 | A1 | 5/2009 | |
| WO | 2012/144087 | A1 | 10/2012 | |
| WO | 2013/061942 | A1 | 5/2013 | |
| WO | 2014/136748 | A1 | 9/2014 | |

OTHER PUBLICATIONS

Japanese Office Action (with English translation), Japanese Application No. 2016-556362, dated Mar. 20, 2018 (6 pages).
Extended European Search Report, European Application No. 15854952.7, dated May 24, 2018 (8 pages).

* cited by examiner $$B(\lambda) = \frac{2hc^2}{\lambda^5} \frac{1}{e^{hc/\lambda kT} - 1}$$

WHITE LIGHT SOURCE AND WHITE LIGHT SOURCE SYSTEM

CROSS-REFERENCE TO RELATED APPLICATIONS

This application is a continuation of prior International Application No. PCT/JP2015/005418 filed on Oct. 28, 2015, which is based upon and claims the benefit of priority from Japanese Patent Application No. 2014-219532 filed on Oct. 28, 2014; the entire contents of all of which are incorporated herein by reference.

FIELD

Embodiments described herein relate generally to a white light source and a white light source system.

BACKGROUND

In an art object and a craft object, color is one of important characteristics. However, a painting and a pot themselves do not emit light. Accordingly, when a showpiece is appreciated in an art gallery, a museum, or the like, illumination is as important as a work. That is because an appreciator of the showpiece observes light reflected on a surface of the showpiece in visible light irradiated from an illumination light source. Accordingly, no matter how beautiful color an artist expresses, as long as light irradiated to the showpiece does not contain a light-emitting component corresponding to a specific color, the showpiece is observed as a color tone which is dim and poor in a color sense by the appreciator, for example.

A most preferable light as light which is used for illuminating such a showpiece in the art gallery, the museum, or the like is sunlight. The sunlight is constituted of wavelength components of continuous light and almost equally contains all light components from 400 nm to 760 nm which are visible light wavelengths. Accordingly, the sunlight makes it possible to reproduce colors of all substances which exist in nature as original colors in the substances. However, even when the sunlight is excellent as light for an application to the above-described illumination, a high-class art object such as the painting is not often appreciated under direct exposure to the sunlight in bright space outdoors, for example. One of reasons why the art object is housed and appreciated in a specific location such as the art gallery is because it is kept from wind and rain and an accident such as a theft.

As an important reason other than the above-described reason, protection of the art object from a large amount of light irradiation can be cited. This is because the sunlight contains the visible light of all wavelengths and contains the light-emitting components other than the visible light, such as ultraviolet light and infrared light. Because in particular, energy of the ultraviolet light is higher than energy of the visible light, the direct exposure of the art object such as a historic painting to the sunlight accelerates, for example, color fading, brittleness, or the like, for example. Therefore, an artificial light source is required, and in addition to convenient features of artificial light, in which light intensity can be adjusted, ultraviolet amount is reduced as much as possible, and the like, a light source capable of reproducing sunlight faithfully is required, for example.

In recent years, from the viewpoint of energy saving and reduction in an amount of carbon dioxide emission, a light source using a light emitting diode (LED) has received attention as the artificial light source. The LED has a longer operating life and saves energy compared with a conventional incandescent light bulb using a tungsten filament. Further, a market for LED lighting is growing rapidly owing to convenience of the LED. As conventional LED lighting, there is a lot of LED lighting of a type in which white light is obtained by combining a blue LED and a yellow phosphor. The above-type LED lighting has been short of warmth of light, and light of the LED lighting has been unnatural white light. LED products remarkably improve in performance with expansion of the market. Accordingly, thereafter, as a result of improvement regarding the combination of the LED and the phosphor, a white light source capable of reproducing light equal to sunlight is being developed.

As the white light source which emits light of an emission spectrum equal to the sunlight, the white light source in which the sunlight with different color temperatures is reproduced by a black body radiation spectrum of the same color temperature can be cited, for example. In the above-described white light source, not only apparent white light but also white light approximating the sunlight in an emission spectrum shape of the white light can be obtained with respect to the sunlight whose color temperature changes with time. Further, as a lighting system using the white light source, the lighting system such as office lighting in which the center of an object of lighting is a human or the like can be cited, for example. The above-described lighting system is a system which allows adjustment of a color temperature and illuminance of indoor light while detecting a change in outdoor light. The above-described lighting system makes it possible to obtain white light corresponding to a human physiological phenomenon and a change in seasons, for example. Further, as a system using the white light source, an artificial sunlight system in which a plurality of light emitting diode modules with different color temperatures are combined with one another can be cited. The above-described artificial sunlight system allows reproduction of a change in the color temperature of sunlight irradiated at points whose latitude and longitude are different on the earth.

DETAILED DESCRIPTION

Figures 1, 2:
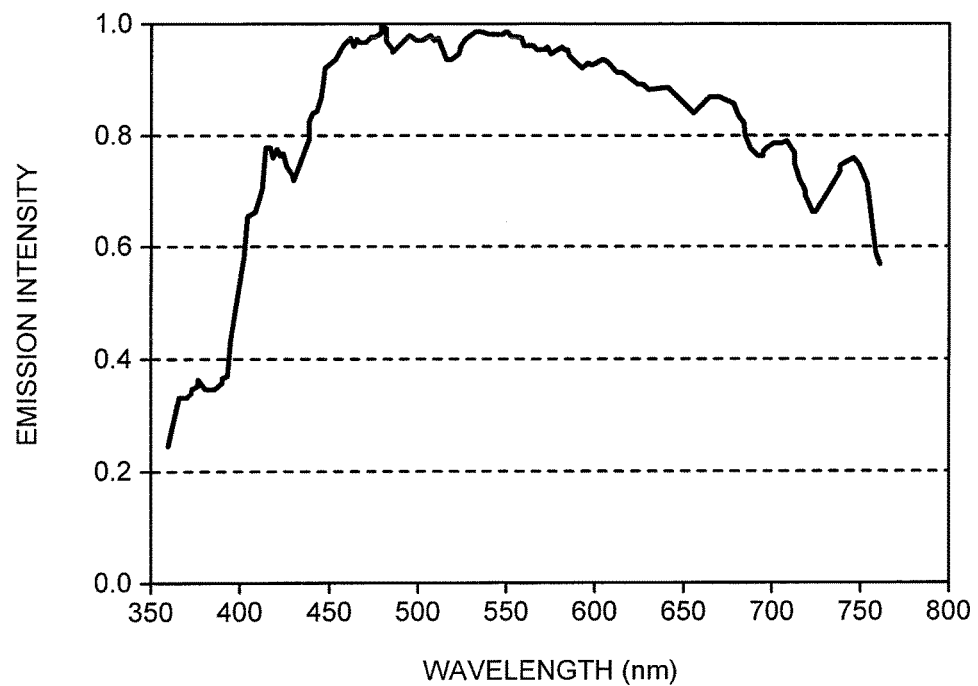
FIG. 1 is a mathematical expression representing an emission spectrum of black body radiation.
FIG. 2 is a chart illustrating an emission spectrum of sunlight at 10 o'clock on May 14 in Yokohama City.

A white light source of an embodiment includes a light source unit. Light which is emitted from the light source unit is a chromaticity point on a CIE chromaticity diagram and has a correlated color temperature corresponding to a chromaticity point including a deviation of −0.005 or more to +0.005 or less with respect to a black body radiation locus, and satisfies a formula: $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$ ($P(\lambda)$ represents an emission spectrum of the white light, $B(\lambda)$ represents a spectrum of black body radiation having a color temperature corresponding to the correlated color temperature of the white light, $V(\lambda)$ represents a spectrum of spectral luminous efficiency, $\lambda max1$ represents a wavelength in which $P(\lambda) \times V(\lambda)$ is a maximum value, and $\lambda max2$ represents a wavelength in which $B(\lambda) \times V(\lambda)$ is a maximum value).

A white light source of an embodiment includes a light source unit capable of emission of light. The light source unit emits light in response to applied current. The light emitted from the light source unit is white light.

In recent years, a plurality of white light sources capable of reproduction of sunlight have been proposed. Further, many products capable of the reproduction of sunlight, which are different from the above-described white light source, have been also known in a market. As these lighting products, there are many lighting products which emit light approximating sunlight at random moments and lighting products which focus on a color temperature change in sunlight to make an approximation of the sunlight even when a change in the sunlight is captured. In contrast, a method of controlling change data of a color temperature and a light characteristic of sunlight due to differences in times and locations is also considered. However, for example, in the above-described artificial sunlight system, a change in the light characteristic other than the color temperature is not explained specifically or is not improved.

The change in sunlight is not limited to only the color temperature. The sunlight also changes depending on an irradiation rate, and purity and turbidity, for example. The change including these elements in addition to the color temperature is a large factor which causes a different climate for each region.

For example, when Japanese regions are divided into a plurality of regions of a region along the Sea of Japan and a region along Pacific Ocean, there are many cloudy, rainy, and snowy days in the region along the Sea of Japan. Further, the atmosphere in the region along the Sea of Japan contains many suspended substances such as water vapor and dust. Therefore, sunlight is shielded and a color of matter becomes dull.

The region along Pacific Ocean has high purity of the atmosphere due to less water vapor. Accordingly, the color of the matter is a clear color. Hence, a difference in color preference occurs depending on the region, and people living in the region along the Sea of Japan tend to prefer a dull color and people in the region along Pacific Ocean tend to prefer a clear color.

An art object such as a painting is a creation by a human being. Accordingly, it is an original work made by an individual. However, a color of a work cannot be expressed by avoiding an effect of environment. Although that is natural for a realistic painting, there is a possibility that emphasis on red or blue and selection of preferring the clear color or the dull color, or the like are already affected by a climate or the like in an abstract painting.

Even if the above-described selection is based on purely individual sensitivity, an effect of light cannot be avoided as long as color expression of the creation is distinguished by reflected light of the light from a light source. That is, even though an artist emphasizes red with a personal intention, a degree of the emphasis is affected by an amount of a red light-emitting component of the same wavelength contained in the light source.

In art appreciation or the like, in order to understand a true value of a work, it is very important not only to reproduce sunlight simply but also to reproduce light of the same environment as a creation environment of the work. That is, the work is appreciated under light of an environment in which a country and a region in which the work is created, a season and a time, and further a period and weather are the same as an experience environment of the artist, thereby allowing understanding of the work the same as the artist understands.

The white light source of the embodiment reproduces sunlight with various color temperatures. That is, when sunlight with a specific color temperature is reproduced, a spectrum of black body radiation with the same color temperature as that of the sunlight is regarded as an emission spectrum of the sunlight, and thereby white light approximates a shape of the spectrum of the black body radiation. The sun can be considered as one type of a black body. A degree of coincidence of a spectral curve of the black body radiation and an emission spectrum curve of the sunlight is good. An emission spectrum distribution of real sunlight is considered to approximate the spectrum of the black body radiation with a color temperature of 5800 K.

The emission spectrum of the real sunlight arriving on the earth sometimes deviates from the spectrum of the black body radiation slightly. That is because the sunlight passes through a layer of air, water vapor, dust, or the like on the surface of the earth and light with a specific wavelength is scattered, until it arrives on the earth even though the emission spectrum of the sunlight approximates the spectrum of the black body radiation. It is possible to reproduce a macro change due to scattering of blue light, or the like as a change in the color temperature. However, it is difficult to go so far as to artificially reproduce a micro uneven waveform which occurs in a specific wavelength region of the emission spectrum.

Such a slight difference is a factor which causes a difference in the climate depending on the region. The white light source of this embodiment is a white light source contrived in order to allow reproduction of the above-described slight difference. Specifically, it is a white light source which converts a degree of a deviation between a spectrum of sunlight arriving on the ground and a black body radiation spectrum of the same color temperature as that of the sunlight into a deviation from a black body locus in a CIE chromaticity diagram to reproduce white light with a correlated color temperature corresponding to a chromaticity point having a predetermined deviation.

The white light source of the embodiment makes it possible to reproduce a spectral shape of the black body radiation, and moreover make the spectral shape approximate an emission spectrum having the same shape as that of the sunlight arriving on the ground including a time difference and a regional difference. Therefore, for example, utilizing the above-described white light source for museum lighting used as lighting for a showpiece such as an art object makes it possible that light for irradiating the showpiece approximates light of the same environment as a creation time and a creation location of the showpiece and lighting capable of reproducing intention of the artist more faithfully is obtained.

As described above, an object of the white light source of the embodiment is to reproduce sunlight more faithfully. In order to reproduce the sunlight faithfully, it is necessary to accurately capture the emission spectrum of the sunlight which changes depending on times and locations.

A change due to a difference in latitude and longitude of the earth occurs because a distance passed through the atmosphere on the surface of the earth is different due to a difference in incident angle of sunlight. That is, that is because when the sunlight passes in the atmosphere, the sunlight is scattered by suspended gas molecules or the like in the air and a difference occurs in a degree of the scattering of the blue light or the like depending on the passing distance. Macro capture of such a change in the sunlight is possible as a difference in the color temperature. In this case, the emission spectrum of the sunlight with different color temperatures can be approximated by the black body radiation spectrum of the color temperatures corresponding thereto.

An expression represented in FIG. 1 makes it possible to relatively easily reproduce various emission spectra with different color temperatures. In FIG. 1, h represents the Planck's constant, c represents light speed, λ represents a wavelength, e represents a base of a natural logarithm, k represents the Boltzmann constant, and T represents a color temperature. In the black body radiation spectrum, h, c, e, and k are constants. Accordingly, determination of the color temperature makes it possible to find the emission spectrum corresponding to the wavelength.

The emission spectrum of sunlight changes due to not only the difference in the latitude and the longitude but also the regional difference. In this case, various factors can be cited as factors of the change. For example, light scattering is affected by not only molecules of air and gas but also fine particles of water vapor, dust, and the like. Concentrations of the water vapor, the dust, and the like are different depending on the region. For example, a large difference exists between a region near the sea and a region near a desert. An effect of not only the scattering but also reflection cannot be ignored. That is, light which a human being perceives as sunlight includes light which reflects after arriving on the ground in addition to direct light pouring from the sun. It is natural that a light component contained in reflection light is different among the region near the sea, a region near forest, and an urban area where buildings are dense. Thus, a change in sunlight due to the regional difference is caused by complicated entanglement of a plurality of factors. In the above-described change, there is no general regularity. Accordingly, it is necessary to understand that the above-described change is a change based on an indigenous factor.

In order to reproduce such a change in sunlight, in this embodiment, the emission spectrum of sunlight which changes for each region and time is surveyed, and as much data as possible is collected to be stored and utilized. This leads to reproduction of the sunlight. Specifically, emission spectra of sunlight are measured in major regions in the world, and a change for each time in a day and a change for each season in a year are accumulated as data. Note that the data accumulated in this embodiment is data regarding fine days in principle. Therefore, effects of cloudiness, rain, snow, and the like are not considered.

Figure 3:
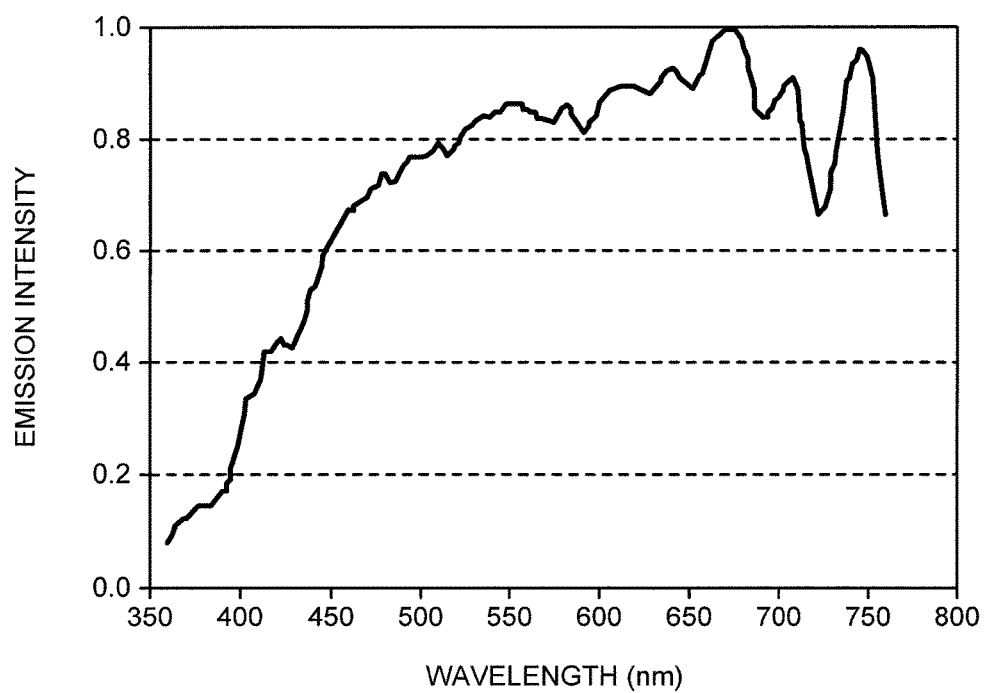
FIG. 3 is a chart illustrating an emission spectrum of sunlight at 17 o'clock on May 27 in Tokyo Metropolis.

FIG. 2 illustrates one example of an emission spectrum of sunlight at 10 o'clock on May 14 in Yokohama City in Japan. FIG. 3 illustrates one example of an emission spectrum of sunlight at 17 o'clock on May 27 in Tokyo Metropolis. These emission spectra can be measured by the following method, for example.

A light detecting portion of a color measuring device (spectral distribution measuring device) provided with a diffraction grating and having a decomposition function of a wavelength component of light intensity is pointed to the sun. Thus, sunlight is directly taken in the spectral distribution measuring device to measure the emission spectrum. A wavelength range of measurement falls within a range of 360 nm to 760 nm and covers a visible light range. Intensity of light taken in the spectral distribution measuring device is adjusted by an exposure time adjustment function included in the measuring device. At this time, it is preferable that there is no saturation phenomenon even in a wavelength region where the intensity of the light is large. The intensity of the light for each wavelength is calculated from electronic data of a measured result, and a CIE chromaticity coordinate value of the sunlight, a correlated color temperature of the sunlight, and a deviation of the sunlight are calculated in accordance with the result. The deviation is a deviation of a chromaticity point which specifies the correlated color temperature with respect to a black body radiation locus of the same color temperature as the correlated color temperature, for example.

Any emission spectrum is a jagged curve. Subjecting this emission spectrum to smoothing makes it possible to make the emission spectrum approximate a shape of a black body radiation spectrum of a specific color temperature. When FIG. 2 and FIG. 3 are compared, uneven positions in spectral curves overlap with each other. It is found from this that the respective uneven portions are based on not noise or the like but an intrinsic factor such as a specific suspended substance or the like. The emission spectra illustrated in FIG. 2 and FIG. 3 each have three characteristic uneven portions over wavelengths of 650 nm to 750 nm. From a largest degree of the above-described three uneven portions, it is assumed that shapes of emission spectra of these wavelength regions are one factor which is different due to the regional difference or the like. When correlated color temperatures of white light are calculated based on the shapes of the emission spectra in FIG. 2 and FIG. 3, the correlated color temperature in FIG. 2 is 5495 K+0.001 duv and the correlated color temperature in FIG. 3 is 4483 K−0.001 duv.

The above is a comparison of only two locations, but data of emission spectra of sunlight in each of regions and at each of times is compared to be evaluated, thereby checking the entire tendency. Thus, it is found that chromaticity points of emission colors present points close to a black body locus on a (x,y) chromaticity diagram. Further, it is found that the chromaticity points of the emission colors do not entirely correspond with points on the black body locus and in almost all data, color temperatures are from 2600 K to 6500 K and color temperatures corresponding to a range of a region including chromaticity points whose deviation is ±0.005 duv with the black body radiation locus sandwiched.

Figure 4:
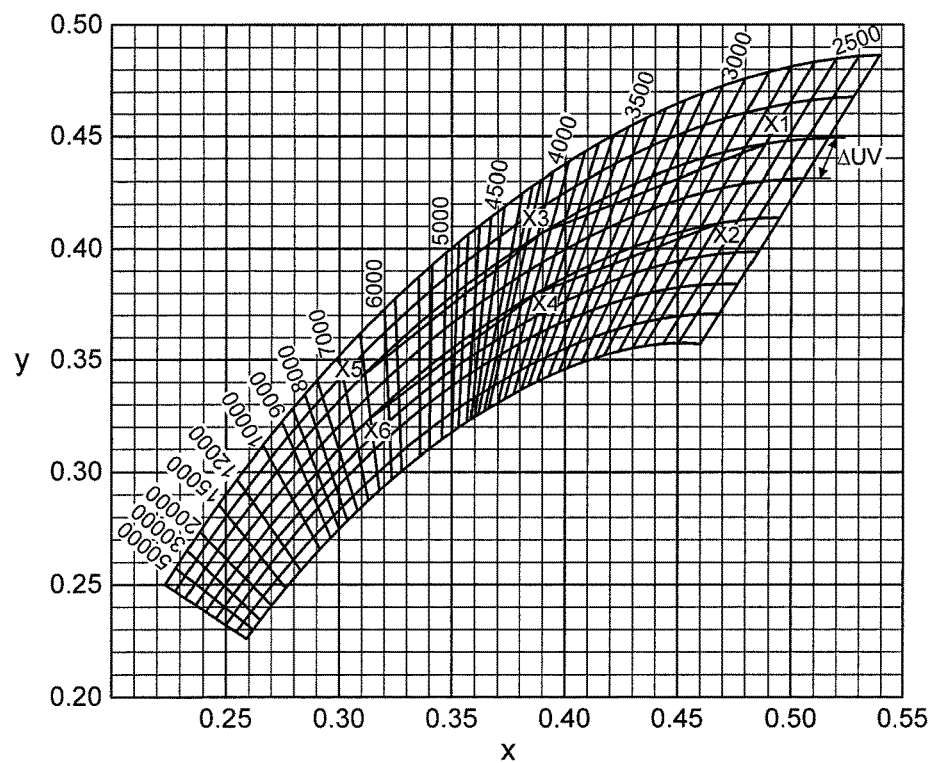
FIG. 4 is a diagram illustrating an emission chromaticity region which a white light source of this embodiment exhibits.

FIG. 4 is a diagram (CIE chromaticity diagram) illustrating an emission chromaticity region of the white light source of this embodiment. Using a plurality of white light sources with different color temperatures and deviations makes it possible to reproduce all emission colors in a range of a square or polygonal shape in the emission chromaticity region. Specifically, for example, as illustrated in FIG. 4, it is possible to reproduce the emission colors in a range surrounded by a straight line connecting X1, X2, X3, X4, X5, and X6 in the diagram. X1, X2, X3, X4, X5, and X6 are the chromaticity points. A white light source system of the embodiment includes four or six types of white light sources corresponding to X1, X2, X3, X4, X5, and X6, for example.

A correlated color temperature corresponding to X3 is higher than a color temperature corresponding to X1 and lower than a correlated color temperature corresponding to X5. A correlated color temperature corresponding to X4 is higher than a color temperature corresponding to X2 and lower than a correlated color temperature corresponding to X6. That is, the correlated color temperature corresponding to X3 and X4 is higher than a correlated color temperature corresponding to X1 and X2, and the correlated color temperature corresponding to X5 and X6 is higher than the correlated color temperature corresponding to X3 and X4.

The correlated color temperature corresponding to X1 and X2 is 2600 K or more to 4000 K or less, or 2600 K or more to less than 4000 K, for example. The correlated color temperature corresponding to X5 and X6 is 4000 K or more to 6500 K or less, or 5000 K or more to 6500 K or less, for example.

Each of deviations of X1, X3, and X5 with respect to a black body radiation locus is "0" (zero) or more to +0.005 or less, for example, more than "0" (zero) to +0.005 or less. Each of deviations of X2, X4, and X6 with respect to the black body radiation locus is −0.005 or more to "0" (zero) or less, for example, −0.005 or more to less than "0" (zero).

Mixing the plurality of white light sources having the color temperatures and the deviations different from each other at optional intensity proportions makes it possible to reproduce all the emission colors in the range of the polygonal shape. More specifically, it is possible to reproduce the emission colors in ranges of a quadrangle surrounded by a straight line connecting X1, X2, X3, and X4, a quadrangle surrounded by a straight line connecting X3, X4, X5, and X6, and further a polygon surrounded by the straight line connecting X1, X2, X3, X4, X5, and X6.

It is found from FIG. 4 that the range of this shape covers the emission colors on a black body locus whose color temperatures are from 2600 K to 6500 K and a white light region in a range where the deviation from the black body locus is ±0.005 duv. Accordingly, in the white light source of this embodiment, it becomes possible to reproduce sunlight in consideration of not only white light simply on the black body locus but also a subtle deviation of a color temperature changing depending on various environmental factors on the earth.

Color reproduction in the range of the specific quadrangle or the like has been explained, but various white light can be reproduced naturally by setting an emission color corresponding to each of vertexes of the quadrangle to white colors with various correlated color temperatures. Further, the white light source of this embodiment can be obtained by mixing four types or six types of white light sources optionally, but utilizing many white light sources such as eight types and further ten types thereof as types of underlying white light sources rather makes it possible to more meticulously reproduce sunlight with various color temperatures.

The white light source system including the plurality of white light sources makes it possible to reproduce white light with a wide range of color temperatures. However, many types of the underlying white light sources complicate design of a system. As long as four types of white light sources are used at the minimum, it is possible to exhibit a function of the white light source system without shortage. A range of the color temperatures of the reproduced white light is from 2600 K to 6500 K, for example, and 2600 K is set to a lower limit and 6500 K is set to an upper limit, and it is possible to select the color temperatures between two optional points as a reproduction range. Thus, light radiated from a light emitter of the white light source system of the embodiment is the chromaticity points on the CIE chromaticity diagram and has relative color temperatures of 2600 K or more to 6500 K or less corresponding to the chromaticity points including the deviation of −0.005 or more to +0.005 or less with respect to the black body radiation locus.

The white light source or the white light source system of this embodiment allows the reproduction of sunlight including not only emission colors but also an emission spectrum. Light of each of six types of the emission colors illustrated at X1 to X6 in FIG. 4 has an emission spectrum distribution approximating black body radiation. Specifically, when an emission spectrum of each white light is represented as P ($\lambda$), an emission spectrum of the black body radiation exhibiting the same color temperature as the relative color temperature of the white light is represented as B ($\lambda$), a spectrum of spectral luminous efficiency is represented as V ($\lambda$), a wavelength in which P ($\lambda$)×V ($\lambda$) becomes maximum is represented as $\lambda$max1, and a wavelength in which B ($\lambda$)×V ($\lambda$) becomes maximum is represented as $\lambda$max2, the emission spectrum of the white light source satisfies the following formula (1).

$$-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2 \quad (1)$$

In the white light source of this embodiment, the emission spectrum of the black body radiation can be reproduced more exactly by satisfying the following formula (2).

$$-0.1 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.1 \quad (2)$$

(P ($\lambda$)×V ($\lambda$)) represents intensity of the emission spectrum of the white light in a spectral luminous efficiency region. (B ($\lambda$)×V ($\lambda$)) represents intensity of the spectrum of the black body radiation in the spectral luminous efficiency region.

In the white light source of this embodiment, at least four types of underlying white light have the emission spectrum approximating the black body radiation. This makes it possible to have each emission color component of sunlight in just proportion. Accordingly, each white light including four types of light at optional proportions can also be considered to include each of emission components which sunlight has. That is, the white light which can be obtained by the white light source of this embodiment has a characteristic of a black body radiation spectrum of each color temperature. Moreover, the white light source of this embodiment makes it possible to reproduce sunlight including a subtle variation in a specific wavelength region.

The white light source of this embodiment has a characteristic in an emission characteristic. Accordingly, as long as sunlight can be reproduced, any composing member may be used. Therefore, application of various light sources is possible, but in order to obtain white light with various correlated color temperatures, a method of adjusting the emission color using a phosphor is the most convenient, and a phosphor application product is preferably used. A light source unit may have a light emitting diode, for example. In particular, a light source made by a combination of an LED and the phosphor is optimum because it has a superior characteristic in not only a characteristic aspect but also a manufacture aspect and an application aspect.

As the LED, it is preferable to use an LED having an emission peak wavelength in an ultraviolet to violet region. The ultraviolet to violet region falls specifically within a range of 360 to 420 nm. When an LED whose emission peak wavelength exceeds 420 nm is used, light of the LED exhibits sharp light emission at a specific wavelength, and therefore a balance with light emission of the phosphor having a generally broad spectral shape deteriorates and it becomes difficult to satisfy relationships of the above-described formulas (1) and (2).

Because visibility is low from an ultraviolet color to a violet color, an effect on white light is small. Moreover, cutting primary light from the LED so as not to go outside the white light source allows an elimination of problems. Note that regarding the type of LED, there is particularly no limited condition other than the emission peak wavelength, and even in an LED for laser emission, a material of the LED is not particularly limited either.

In order that the emission spectrum of the white light source satisfies the relationships of the formulas (1) and (2), it is preferable to use three types or more of a blue phosphor, a blue-green phosphor, a green phosphor, a yellow phosphor, and a red phosphor, and further five types or more of the phosphors as phosphors combined with the LED. Mixing these phosphors optionally in accordance with a spectrum of corresponding black body radiation makes it possible to obtain white light having an optional color temperature or an optional deviation. A specific type of phosphor is not particularly limited as long as an emission peak falls within 420 to 700 nm. Phosphors excited at 350 to 420 nm are preferably the following phosphors, for example.

As the blue phosphor, a europium-activated alkaline-earth phosphate phosphor (peak wavelength of 440 to 455 nm), a europium-activated barium magnesium aluminate phosphor (peak wavelength of 450 to 460 nm), or the like can be cited.

As the blue-green phosphor, a europium-activated strontium aluminate phosphor (peak wavelength of 480 to 500 nm), a europium-manganese activated barium magnesium aluminate phosphor (peak wavelength of 510 to 520 nm), or the like can be cited.

As the green phosphor, a europium-activated orthosilicate phosphor (peak wavelength of 520 to 550 nm), a europium-activated beta-sialon phosphor, (peak wavelength of 535 to 545 nm), a europium-activated strontium sialon phosphor (peak wavelength of 520 to 540 nm), or the like can be cited.

As the yellow phosphor, a europium-activated orthosilicate phosphor (peak wavelength of 550 to 580 nm), a cerium-activated rare-earth aluminum garnet phosphor (peak wavelength of 550 to 580 nm), or the like can be cited.

As the red phosphor, a europium-activated strontium sialon phosphor (peak wavelength of 600 to 630 nm), a europium-activated calcium nitridoaluminosilicate phosphor (peak wavelength of 620 to 660 nm), a europium-activated lanthanum oxysulfide phosphor (peak wavelength of 620 to 630 nm), a manganese-activated magnesium fluorogermanate phosphor (peak wavelength of 640 to 660 nm), or the like can be cited.

The phosphors are mixed with a resin material to be used as a phosphor layer such as a phosphor film. By covering a periphery of an LED chip directly or indirectly with the phosphor film, at least part of the primary light emitted from the LED is absorbed by the phosphor film and converted into secondary light (white light), to be emitted outside the white light source. As long as the resin material is a transparent material, it is not particularly limited. When an ultraviolet to violet LED is used as the LED, a silicone resin or the like having a good deterioration resistance property to ultraviolet rays is preferably used.

The phosphor layer may include the blue phosphor of 85 mass % or more and 94 mass % or less, the green phosphor of 2 mass % or more and 3 mass % or less, the yellow phosphor of 2 mass % or more and 4 mass % or less, and the red phosphor of 2 mass % or more and 8 mass % or less, total amount of the phosphors is 100 mass %.

In the white light source of this embodiment, white light emission is obtained by a combination of phosphor light emission. In the primary light from the LED, as much energy as possible is preferably absorbed by the phosphors. Moreover, leakage of light of the LED outside the light source is to be avoided. In particular, when LED light contains ultraviolet rays, there is a possibility that an art object and the like are impaired. Therefore, leakage prevention is required.

In an LED module of this embodiment, in order to prevent the leakage of the ultraviolet rays, a thickness of the phosphor film is preferably sufficient thickness. The phosphor film is made thick so that the phosphor film does not transmit the primary light of the LED reflected on an individual phosphor particle surface and the primary light does not leak outside the light source.

When the thickness of the phosphor film is extremely too large, the light emission itself of the phosphors is not emitted outside the phosphor film either, resulting in a decrease in emission intensity of the phosphor film. In general, it is known that a particle size of a phosphor and an optimum film thickness have a proportionality relation to each other, and in this embodiment a phosphor containing as large particles as possible is used for the phosphor film practically, thereby making the phosphor film as thick as possible. For the above purpose, in the phosphors used for the LED module of this embodiment, an average particle size of a phosphor particle is preferably 10 μm or more to 40 μm or less.

The thickness of the phosphor film corresponding to the particle size is preferable 100 μm or more to 1000 μm or less. This makes it possible to obtain the LED module which does not decrease light emission of the phosphor film as much as possible and which suppresses the leakage of ultraviolet rays as much as possible.

In order to carry out ultraviolet leakage prevention more thoroughly, an ultraviolet absorbing film may be formed on an outer side of the phosphor film. In this case, a fine-grained white pigment of zinc oxide, titanium oxide, aluminum oxide, or the like can be used as an absorption and reflection material for the ultraviolet rays. By dispersing these fine-grained pigments in resin similarly to the phosphor film and forming the ultraviolet absorbing film on the outer side of the phosphor film directly or indirectly, the intended LED module can be obtained. The LED module of this embodiment makes it possible to reduce light emission energy of the primary light which is emitted from the LED module to 0.4 mW/1 m or less.

An amount of the primary light is found by the following method, for example. As represented by the following formula (3), an emission spectrum of white light emitted from the light source unit is represented as P (λ) and the spectrum of the spectral luminous efficiency is represented as V (λ), and the both are multiplied to be integrated, thereby finding φ.

[Mathematical expression 1]

$$\phi = 683 \cdot \int P(\lambda) \cdot V(\lambda) d\lambda \quad (3)$$

Primary light energy emitted from the LED is found by the following method, for example. As represented by the following formula (4), a spectrum F (λ) is integrated in a range of 360 to 420 nm, thereby finding UV.

[Mathematical expression 2]

$$UV = \int_{360}^{420} P(\lambda) d\lambda \quad (4)$$

Energy of the primary light per luminous flux of light emission emitted from the light source unit is found by UV/φ, for example.

Figure 5:
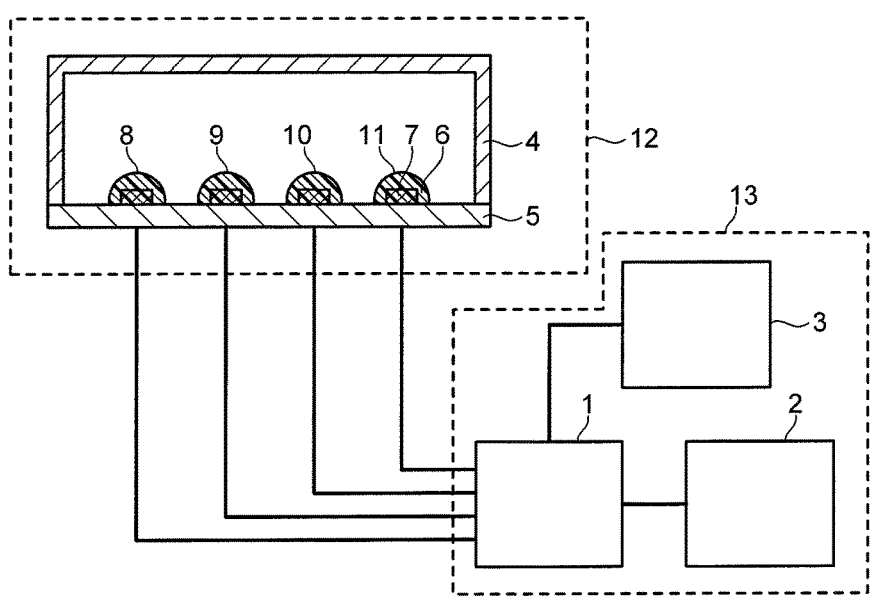
FIG. 5 is a schematic view of a white light source system of this embodiment.

FIG. 5 illustrates an overview of the white light source system of this embodiment. The white light source system illustrated in FIG. 5 includes: a light emitter 12 which includes a plurality of types of LED modules (LED modules 8 to 11); and a controller 13 which controls light emission of the LED modules.

The LED modules 8 to 11 are provided on a substrate 5. Each of the LED modules 8 to 11 includes an LED chip 7 and a phosphor layer 6 which covers the LED chip 7. The light emitter 12 may include a reflector and a lens, and further a globe for diffusing output light, and the like as necessary. Further, an envelope 4 surrounding the LED modules 8 to 11 may have various shapes such as a regular hexahedron, a rectangular parallelepiped, a column shape, and a disk shape in accordance with application.

The LED modules 8 to 11 each include the above-described white light source, for example. Accordingly, white light which is emitted from the light emitter 12 is mixed light of white light which is emitted from each of the LED modules 8 to 11. The mixed light may have correlated color temperatures corresponding to chromaticity points in the region surrounded by the straight line connecting X1 to X6, for example.

Light which is emitted from the LED module 8 may have the correlated color temperature represented as X1 in FIG. 4, for example, and light which is emitted from the LED module 9 may have the correlated color temperature represented as X2 in FIG. 4, for example, and light which is emitted from the LED module 10 may have the correlated color temperature represented as X5 in FIG. 4, for example, and light which is emitted from the LED module 11 may have the correlated color temperature represented as X6 in FIG. 4, for example.

The controller 13 can control emission intensity of each of the LED modules 8 to 11. The controller 13 illustrated in FIG. 5 includes a microprocessor 1, a memory 2, a data input/output unit 3, and an electronic circuit (not illustrated).

The memory 2 stores a plurality of data indicating emission spectra of sunlight observed in a plurality of major regions within and outside Japan on the earth, a plurality of data indicating correlated color temperatures thereof, a plurality of data indicating deviations thereof, and the like. Each plurality of data are classified on the bases of "latitude" and "longitude" for each unit of "date" and "time".

A system user can select optimum data from the stored data in the memory 2 by inputting location data and time data to the data input/output unit 3. The location data indicates one of the regions and includes data such as latitude and longitude and a city name thereof. The time data indicates one of dates and one of times.

When a location and a time are specified, the data of the emission spectrum, the correlated color temperature, the deviation, and the like of sunlight corresponding to the location information and the time information is specified, and the microprocessor 1 calculates mixing intensity proportions of the four white light sources (LED modules 8 to 11).

The electronic circuit can control the microprocessor 1, the memory, and the emission intensity of the LED modules 8 to 11. The electronic circuit controls an amount of current which is supplied to each of the LED modules in accordance with a calculation result by the microprocessor 1. For example, the electronic circuit is controlled by a control signal generated by the microprocessor 1. Accordingly, it is possible to obtain light having intended emission spectrum, relative color temperature, and deviation.

EXAMPLES

Examples of a white light source system capable of reproducing sunlight at optional location and time will be described. A case of reproducing white light in major cities within and outside Japan will be described in the examples.

Example 1

Figure 6:
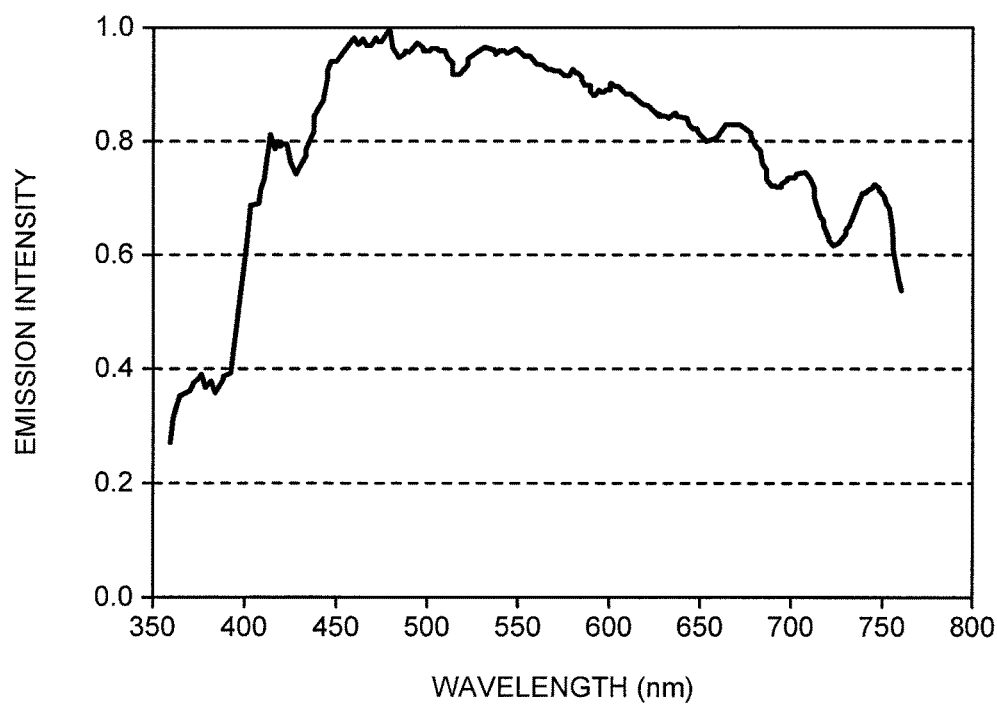
FIG. 6 is the chart illustrating the emission spectrum of the sunlight at 10 o'clock on May 14 in Yokohama City.
Figure 7:
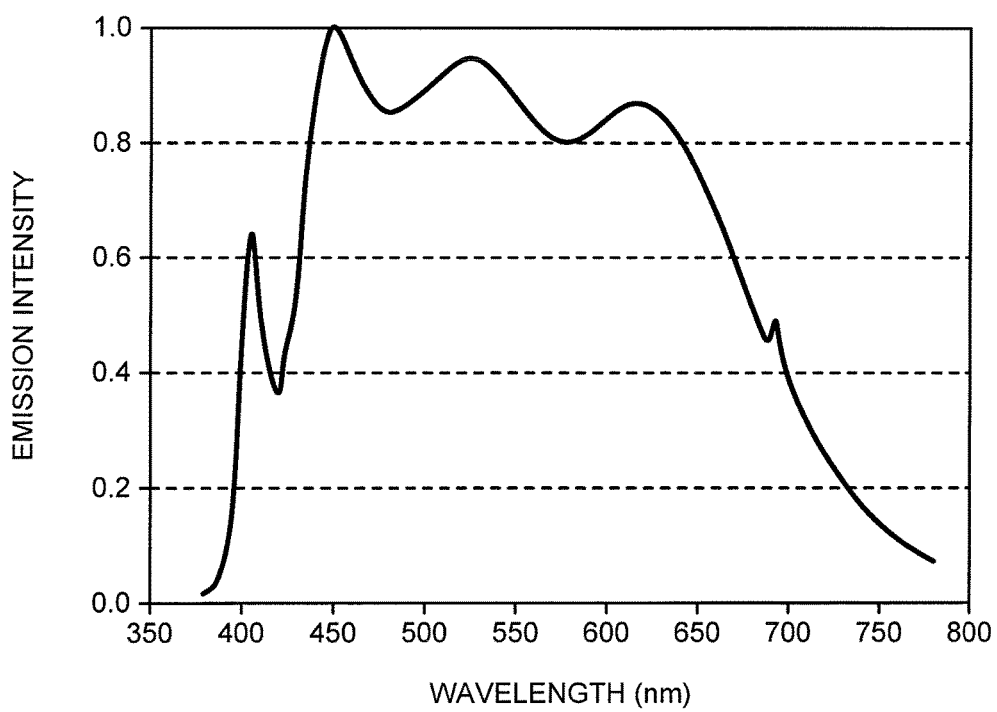
FIG. 7 is a chart illustrating an emission spectrum of a white light source system in Example 1.

A blue phosphor, a green phosphor, a yellow phosphor, and a red phosphor were mixed. Table 1 presents materials and mixing amounts (mass %) of the respective phosphors. Powders having an average particle size of 25 to 35 μm were used as each of the phosphors. A white light source system which includes four LED modules including four types of white light sources (white light source 1 to white light source 4) with different correlated color temperatures and deviations was produced by applying slurry in which the mixed phosphors were dispersed in a silicone resin around LED chips. A film thickness of phosphor films was 500 to 700 μm. As an LED, an ultraviolet light-emitting LED having an emission peak wavelength at 410 nm was used.

represented by an emission spectrum illustrated in FIG. 7. When shapes of the emission spectra in FIG. 6 and FIG. 7 are compared, it is found that entire shapes of the both exhibit a good degree of coincidence, putting aside whether micro uneven portions exist on an emission spectrum curve.

Figure 8:
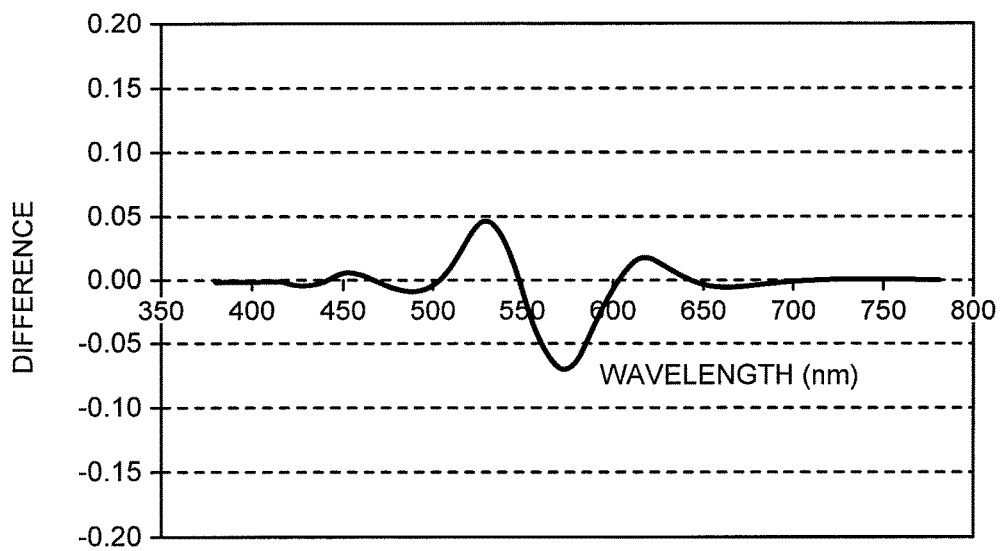
FIG. 8 is a chart illustrating a difference spectrum between a black body radiation spectrum having the same color temperature as that of the sunlight and the emission spectrum of a white light source in Example 1.

In order to check the degree of coincidence of the above-described two types of white light quantitatively, difference spectrum intensity for each wavelength between a spectrum of black body radiation having the same color temperature as that of sunlight and the emission spectrum of the white light emitted from the white light source of this embodiment was measured and compared. Specifically, when the emission spectrum of the white light source is represented as P (λ), an emission spectrum of black body radiation exhibiting the same color temperature as that of the white light source is represented as B (λ), a spectrum of spectral luminous efficiency is represented as V (λ), a wavelength in which P (λ)×V (λ) becomes maximum is represented as λmax1, a wavelength in which B (λ)×V (λ) becomes maximum is represented as λmax2, a definition was made as A=(P (λ)×V (λ))/(P (λmax1)×V (λmax1), B=(B (λ)×V (λ))/(B (λmax2)×V (λmax2) to find a value of (A−B). When illustrated for each wavelength as a graph, the value of (A−B) was illustrated as in FIG. 8.

TABLE 1

| No. | Color Temperature | Blue Phosphor Material Amount (mass %) | Green Phosphor Material Amount (mass %) | Yellow Phosphor Material Amount (mass %) | Red Phosphor Material Amount (mass %) |
|---|---|---|---|---|---|
| 1 | 6320 K + 0.005 duv | Europium-Activated Alkaliine Earth Phosphate Phosphor 93 | Europium-Activated Orthosilicate Phosphor 2 | Europium-Activated Orthosilicate Phosphor 3 | Europium-Activated Calcium Nitridoaluminosilicate Phosphor 2 |
| 2 | 6490 K − 0.002 duv | Europium-Activated Alkaliine Earth Phosphate Phosphor 94 | Europium-Activated Orthosilicate Phosphor 2 | Cerium-Activated Rare-Earth Aluminum Garnet Phosphor 2 | Europium-Activated Strontium Sialon Phosphor 2 |
| 3 | 2610 K + 0.005 duv | Europium-Activated Alkaliine Earth Phosphate Phosphor 85 | Europium-Activated Strontium Sialon Phosphor 3 | Europium-Activated Orthosilicate Phosphor 4 | Europium-Activated Calcium Nitridoaluminosilicate Phosphor 8 |
| 4 | 3050 K − 0.005 duv | Europium-Activated Alkaliine Earth Phosphate Phosphor 87 | Europium-Activated Beta-Sialon Phosphor 3 | Cerium-Activated Rare-Earth Aluminum Garnet Phosphor 2 | Managanese-Activated Magnesium Floregermanate Phosphor 8 |

White light at a predetermined time in a predetermined location was synthesized using four types of white light sources. As sunlight targeted for reproduction, as illustrated in FIG. 6, white light at 10 o'clock on May 14 in Yokohama City was selected. As a result of calculating a color temperature of the white light using emission spectrum data in the figure, it was found that it was 5704 K+0.001 duv.

In order to reproduce white light with this color temperature, mixing intensity proportions of the four types of the white light sources were calculated. As a result, by a mixture in proportions of relative intensity of 100 in the white light source 1, the relative intensity of 90 in the white light source 2, the relative intensity of 70 in the white light source 3, and the relative intensity of 50 in the white light source 4, the white light with completely the same color temperature as that of the white light illustrated in FIG. 6 can be synthesized.

The white light was synthesized specifically in accordance with the calculation result to obtain the white light As can be seen from the figure, in a visible light wavelength region, a difference between the both is 0.05 or less on a + side and −0.1 or more on a − side, and it is found that a relationship of the following formula −0.1≤[(P (λ)×V (λ))/(P (λmax1)×V (λmax1))−(B (λ)× V (λ))/(B (λmax2)×V (λmax2))]≤+0.05 is satisfied. Further, it became clear that intensity of LED primary light leaked from this white light source system was 0.1 mW/1 m when measured and much weaker than that of ultraviolet rays contained in sunlight.

In the white light source system of this embodiment which is produced as described above, a user can obtain white light having a good reproduction characteristic by specifying sunlight at a specific location and a specific time. That is, the emission spectrum of the white light source of this embodiment can exhibit a good degree of coincidence with the spectrum of the black body radiation with the same color temperature as that of the sunlight, in a visible light region.

It was possible not only to reproduce a spectral shape of the black body radiation simply but also to quantify a degree to which light emission by the black body radiation (sun) is affected while arriving at each point on the earth as a deviation from the color temperature of the black body radiation and completely reproduce white light with a color temperature including the deviation. This makes it possible to reproduce sunlight which specifies a region and a location, and moreover obtain a practical light source capable of reproducing an original body color of an art object with much higher accuracy compared with a conventional light source in a case of use as lighting for showpieces in an art gallery or the like, for example, because only ultraviolet rays much weaker than the sunlight are contained.

Example 2

Figure 9:
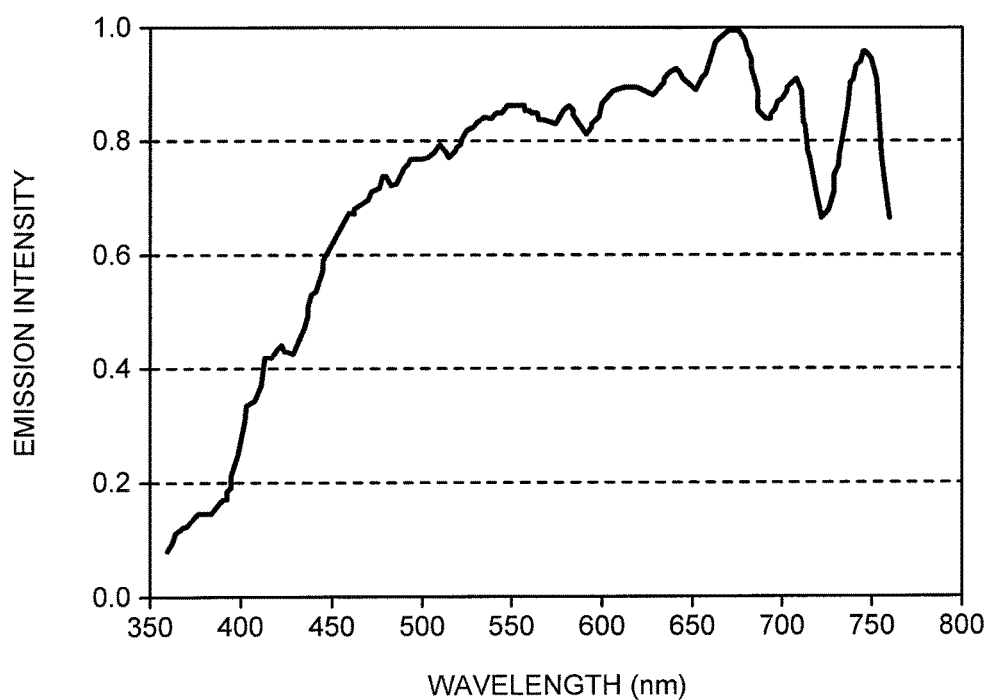
FIG. 9 is the chart illustrating the emission spectrum of the sunlight at 17 o'clock on May 27 in Tokyo Metropolis.

White light at 17 o'clock on May 27 in Tokyo Metropolis was reproduced. As illustrated as a characteristic of this white light in FIG. 9, a color temperature was 4483 K−0.001 duv. In order to reproduce this white light, a white light source system which includes four LED modules including four types of white light sources was produced by using the same types of phosphors as the phosphors used in Example 1 and variously changing combination. Note that in phosphor films in Example 2, for the purpose of ultraviolet absorption, thin films were each formed on an outer side of the phosphor film using mixed slurry of titanium oxide fine particles and resin. Color temperatures of the obtained four types of white light sources and mixing proportions of the respective light sources are presented as in Table 2.

Figure 10:
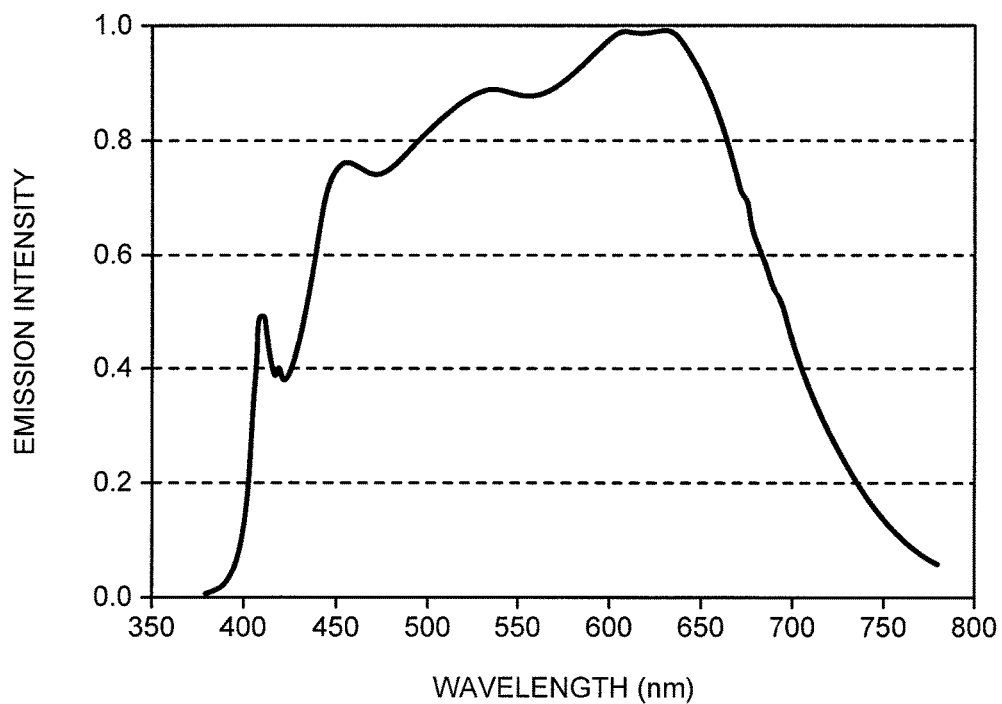
FIG. 10 is a chart illustrating an emission spectrum of a white light source system in Example 2.
Figure 11:
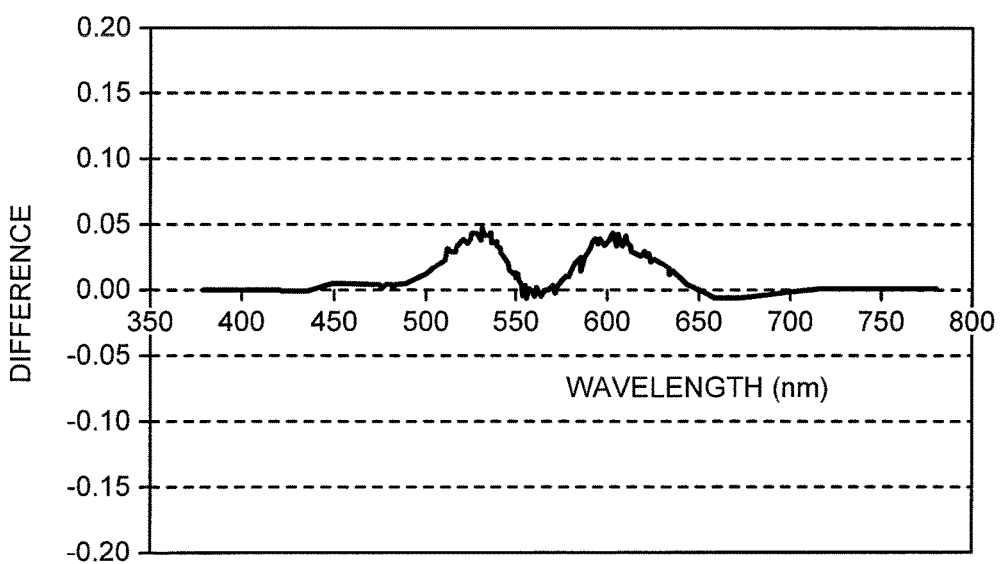
FIG. 11 is a chart illustrating a difference spectrum between a black body radiation spectrum having the same color temperature as that of the sunlight and the emission spectrum of a white light source in Example 2.

FIG. 10 illustrates an emission spectrum of the obtained white light source. As can be seen from the figure, an emission color of the white light source of this embodiment corresponds to an emission spectrum of sunlight well, and measurement of a difference between a black body radiation spectrum and the emission spectrum of the white light source was illustrated as in FIG. 11. It is found by a difference spectrum in the figure that this light source satisfies the following formula. Further, LED primary light leaked from this light source was 0.04 mW/1 m and very weak. Accordingly, the white light source in Example 2 is suitable as art gallery lighting or the like similarly to Example 1.

$$-0.05 \leq [(P(?) \times V(\lambda))/(P(\lambda max1) \times V(\lambda max1)) - (B(\lambda) \times V(\lambda))/(B(\lambda max2) \times V(\lambda max2))] \leq +0.05$$

Example 3

Figure 12:
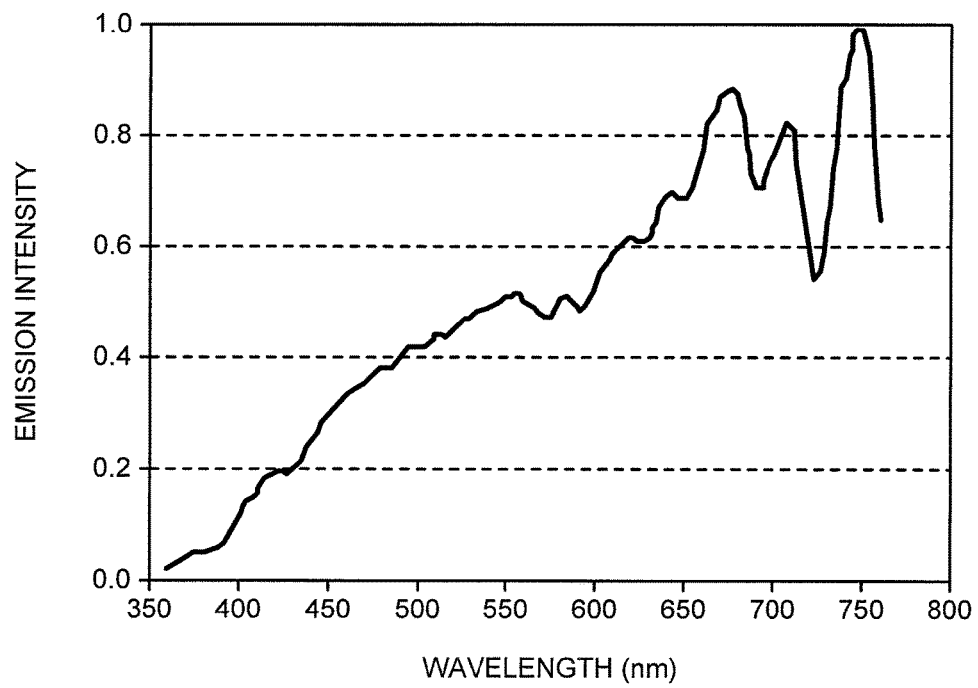
FIG. 12 is a chart illustrating an emission spectrum of sunlight at 17 o'clock on June 10 in Yokohama City.

White light at 17 o'clock on June 10 in Yokohama City was reproduced. As illustrated as a characteristic of this white light in FIG. 12, a color temperature was 3795 K+0.000 duv. In order to reproduce this white light, four LED modules including four types of white light sources were produced by using the same types of phosphors as the phosphors used in Example 1 and variously changing combination. Color temperatures of these four types of white light sources and mixing proportions of the respective light sources are presented as in Table 2.

Figure 13:
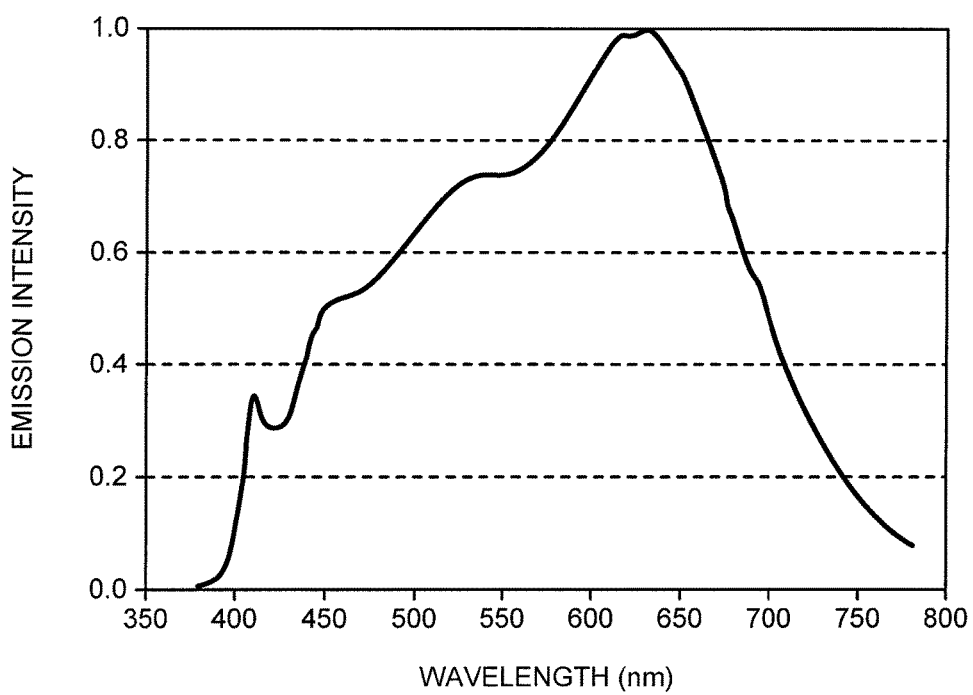
FIG. 13 is a chart illustrating an emission spectrum of a white light source system in Example 3.
Figure 14:
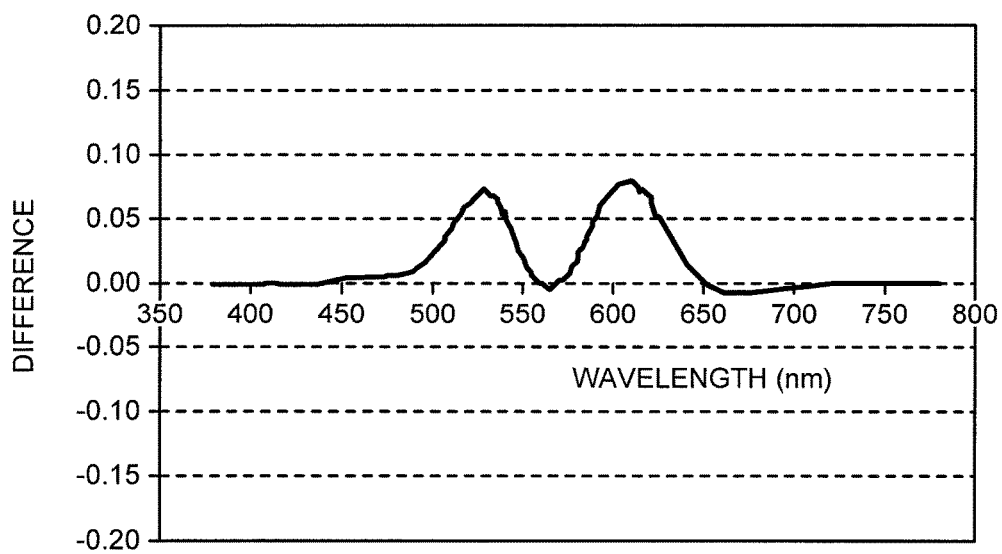
FIG. 14 is a chart illustrating a difference spectrum between a black body radiation spectrum having the same color temperature as that of the sunlight and the emission spectrum of a white light source in Example 3.

FIG. 13 illustrates an emission spectrum of the obtained white light source. As can be seen from the figure, an emission color of the white light source of this embodiment corresponds to an emission spectrum of sunlight well, and measurement of a difference between a black body radiation spectrum and the emission spectrum of the white light source was illustrated as in FIG. 14. It is found by a difference spectrum in the figure that this light source satisfies the following formula. Further, LED primary light leaked from this light source was 0.05 mW/1 m and very weak. Accordingly, the white light source in Example 3 is suitable as the art gallery lighting or the like similarly to Example 1.

$$-0.05 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.10$$

Example 4

Figure 15:
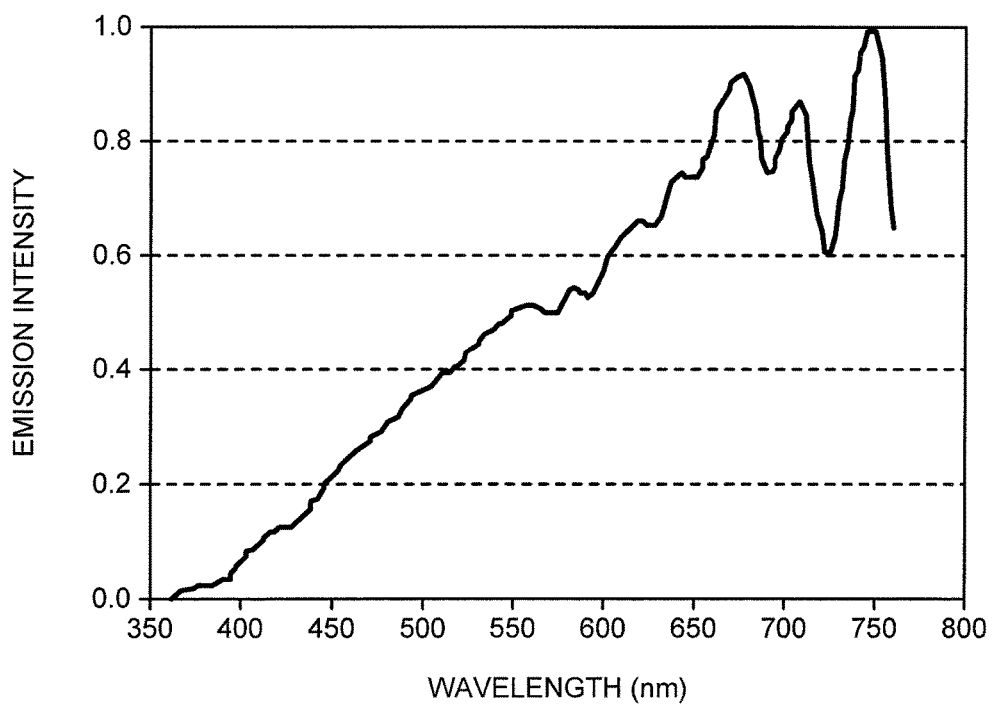
FIG. 15 is a chart illustrating an emission spectrum of sunlight at 18 o'clock on September 20 in Yokohama City.

White light at 18 o'clock on September 28 in Yokohama City was reproduced. As illustrated as a characteristic of this white light in FIG. 15, a color temperature was 3313 K+0.002 duv. In order to reproduce this white light, four LED modules including four types of white light sources were produced by using the same types of phosphors as the phosphors used in Example 1 and variously changing combination. Note that in phosphor films in Example 4, for the purpose of the ultraviolet absorption, thin films were each formed on an outer side of the phosphor film using mixed slurry of zinc oxide fine particles and resin. Color temperatures of the four types of white light sources obtained as described above and mixing proportions of the respective light sources are illustrated as in Table 2.

Figure 16:
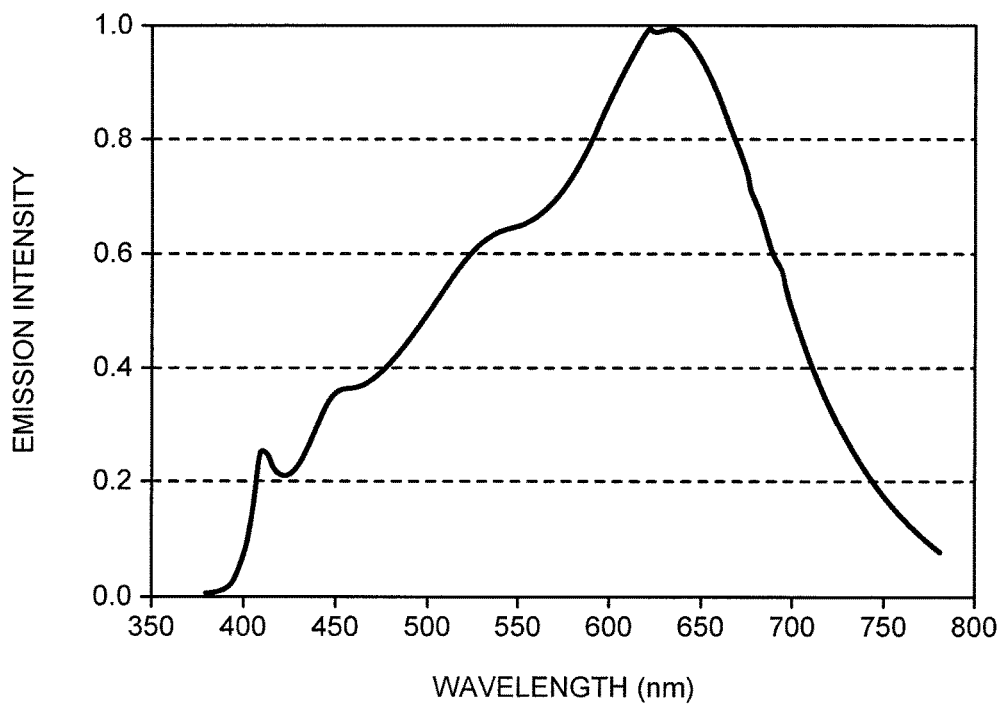
FIG. 16 is a chart illustrating an emission spectrum of a white light source system in Example 4.
Figure 17:
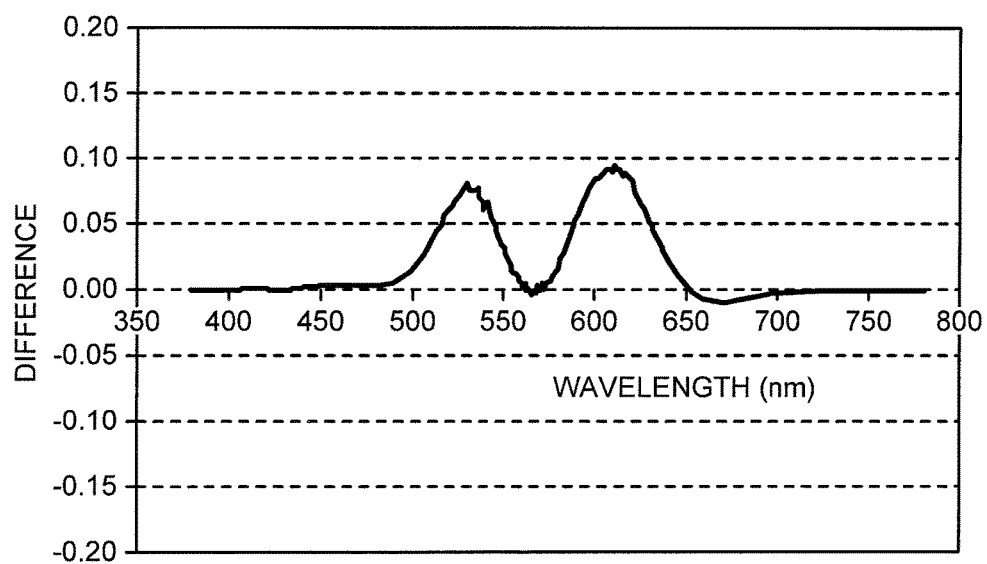
FIG. 17 is a chart illustrating a difference spectrum between a black body radiation spectrum having the same color temperature as that of the sunlight and the emission spectrum of a white light source in Example 4.

FIG. 16 illustrates an emission spectrum of the obtained white light source. As can be seen from the figure, an emission color of the white light source of this embodiment corresponds to an emission spectrum of sunlight well, and measurement of a difference between a black body radiation spectrum and the emission spectrum of the white light source was illustrated as in FIG. 17. It is found by a difference spectrum in the figure that this light source satisfies the following formula. Further, LED primary light leaked from this light source was 0.2 mW/1 m and very weak. Accordingly, the white light source in Example 4 is suitable as the art gallery lighting or the like similarly to Example 1.

$$-0.05 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.10$$

Example 5

Figure 18:
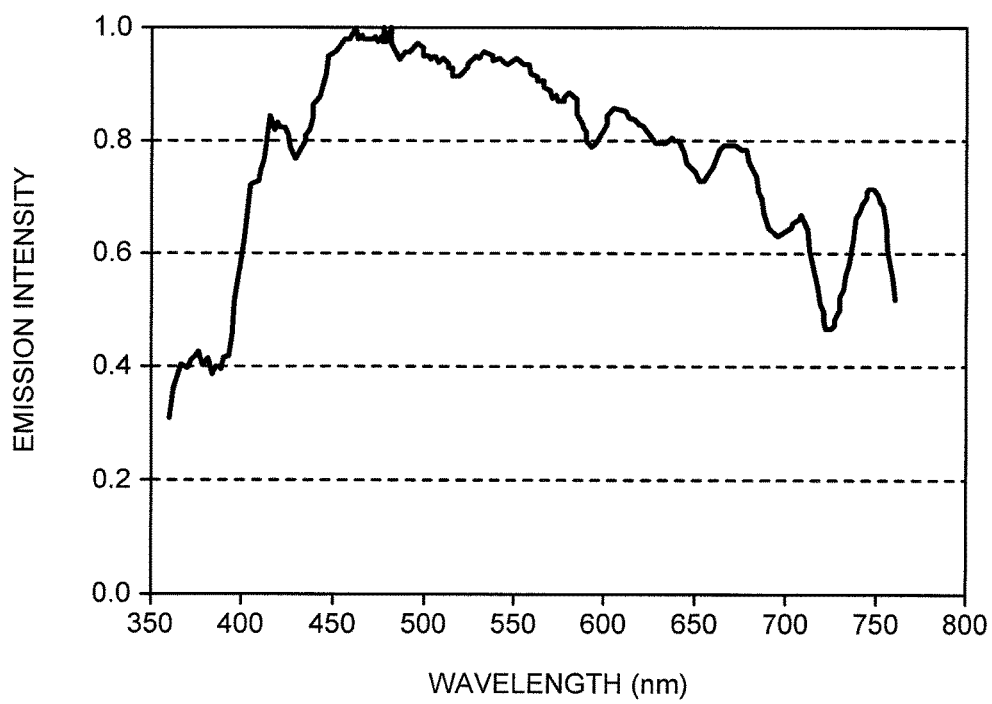
FIG. 18 is a chart illustrating an emission spectrum of sunlight at 13 o'clock on May 20 in Osaka City.

White light at 13 o'clock on May 20 in Osaka City was reproduced. As illustrated as a characteristic of this white light in FIG. 18, a color temperature was 6035 K+0.003 duv. In order to reproduce this white light, four LED modules including four types of white light sources were produced by using the same types of phosphors as the phosphors used in Example 1 and variously changing combination. Color temperatures of these four types of white light sources and mixing proportions of the respective light sources are presented as in Table 2.

Figure 19:
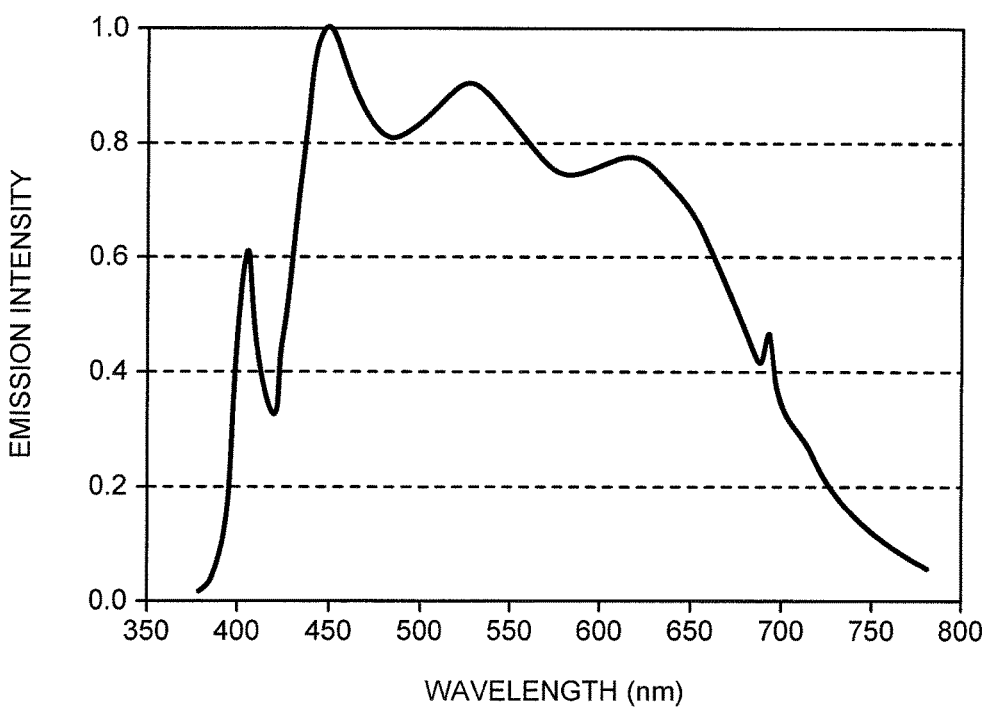
FIG. 19 is a chart illustrating an emission spectrum of a white light source system in Example 5.
Figure 20:
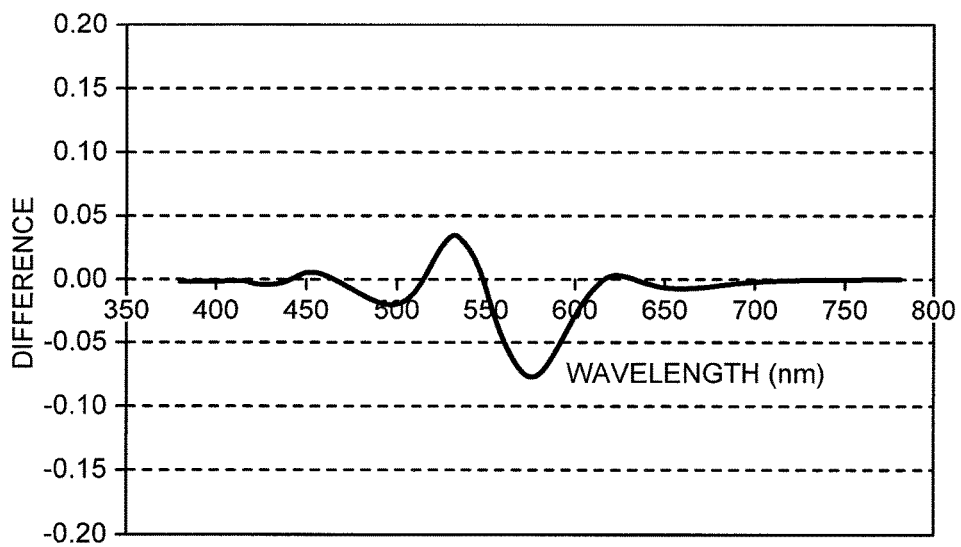
FIG. 20 is a chart illustrating a difference spectrum between a black body radiation spectrum having the same color temperature as that of the sunlight and the emission spectrum of a white light source in Example 5.

FIG. 19 illustrates an emission spectrum of the obtained white light source. As can be seen from the figure, an emission color of the white light source of this embodiment corresponds to an emission spectrum of sunlight well, and measurement of a difference between a black body radiation spectrum and the emission spectrum of the white light source was illustrated as in FIG. 20. It is found by a difference spectrum in the figure that this light source satisfies the following formula. Further, LED primary light leaked from this light source was 0.3 mW/1 m and very weak. Accordingly, the white light source in Example 5 is suitable as the art gallery lighting or the like similarly to Example 1.

$$-0.10 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.05$$

Example 6

Figure 21:
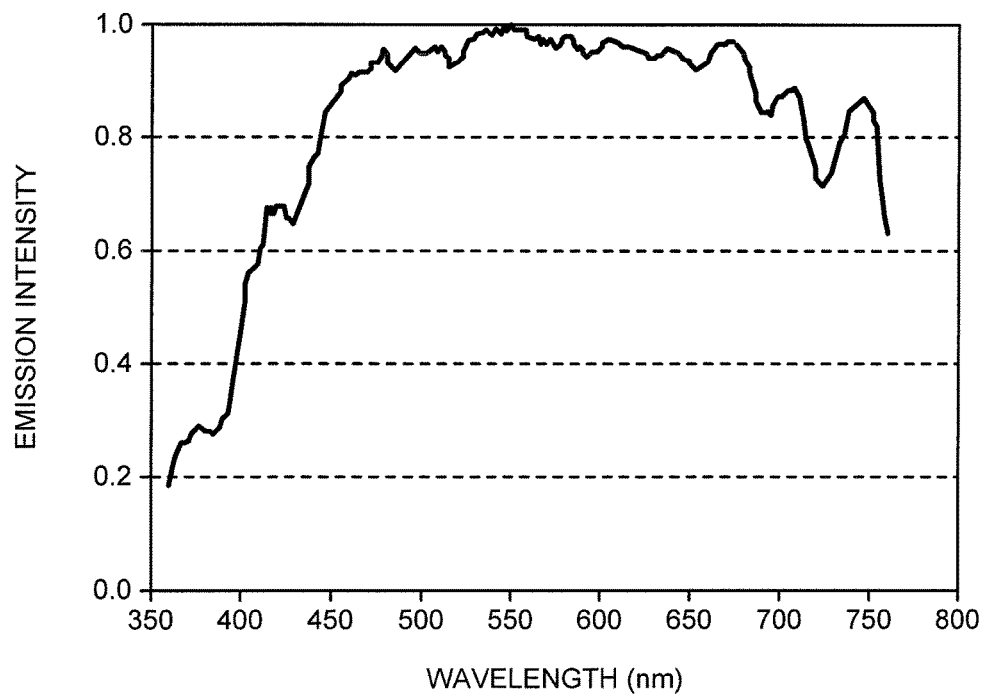
FIG. 21 is a chart illustrating an emission spectrum of sunlight at 15 o'clock on May 20 in Osaka City.

White light at 15 o'clock on May 20 in Osaka City was reproduced. As illustrated as a characteristic of this white light in FIG. 21, a color temperature was 5094 K−0.003 duv. In order to reproduce this white light, four LED modules including four types of white light sources were produced by using the same types of phosphors as the phosphors used in Example 1 and variously changing combination. Color temperatures of these four types of white light sources and mixing proportions of the respective light sources are presented as in Table 2.

Figure 22:
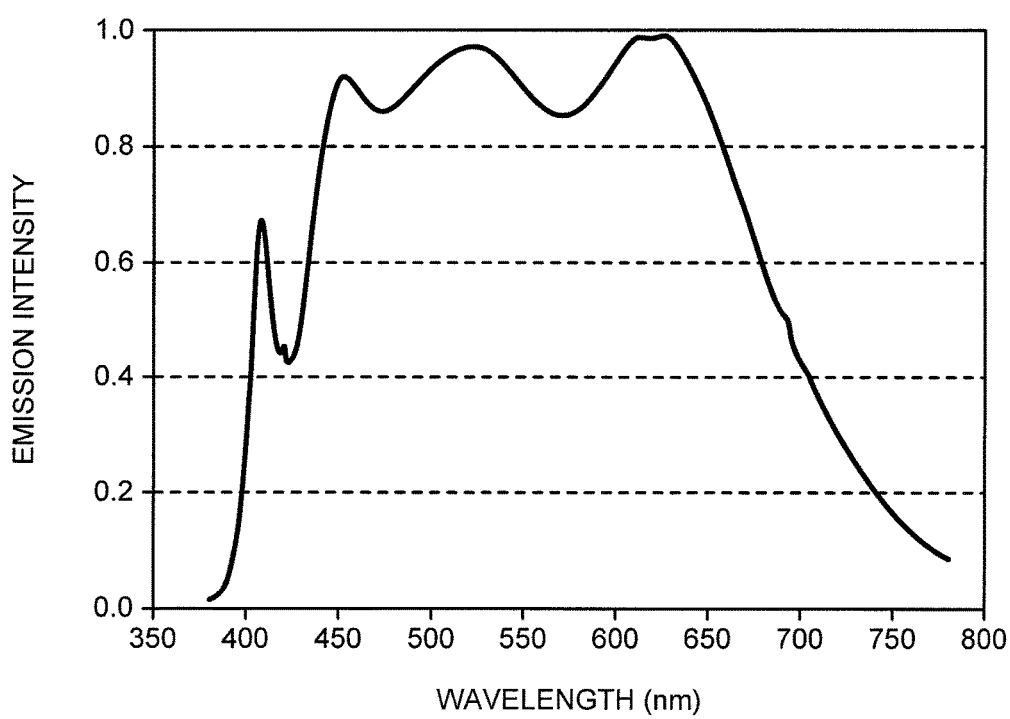
FIG. 22 is a chart illustrating an emission spectrum of a white light source system in Example 6.
Figure 23:
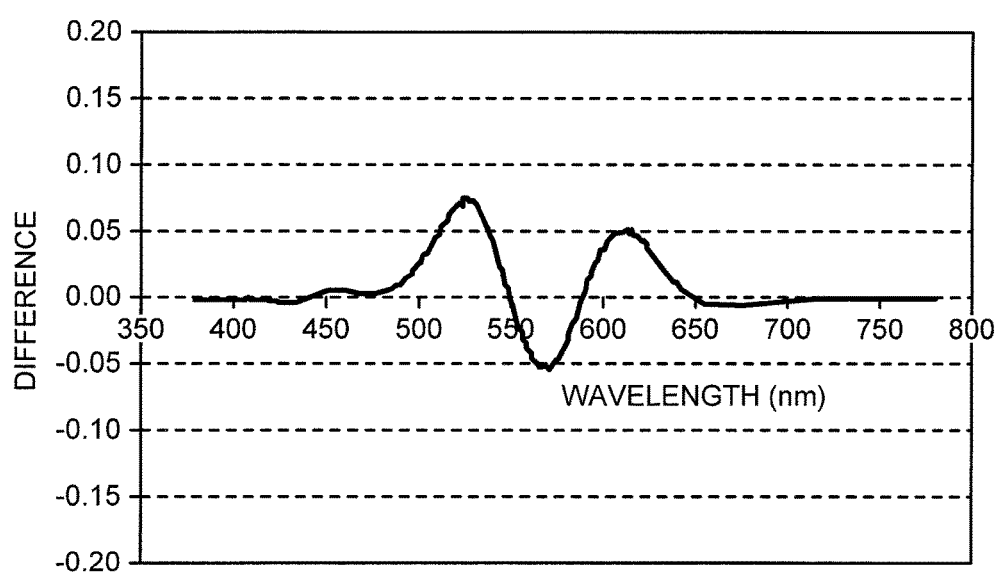
FIG. 23 is a chart illustrating a difference spectrum between a black body radiation spectrum having the same color temperature as that of the sunlight and the emission spectrum of a white light source in Example 6.

FIG. 22 illustrates an emission spectrum of the obtained white light source. As can be seen from the figure, an emission color of the white light source of this embodiment corresponds to an emission spectrum of sunlight well, and measurement of a difference between a black body radiation spectrum and the emission spectrum of the white light source was illustrated as in FIG. 23. It is found by a difference spectrum in the figure that this light source satisfies the following formula. Further, LED primary light leaked from this light source was 0.1 mW/1 m and very weak. Accordingly, the white light source in Example 6 is suitable as the art gallery lighting or the like similarly to Example 1.

$$-0.05 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.10$$

Example 7

Figure 24:
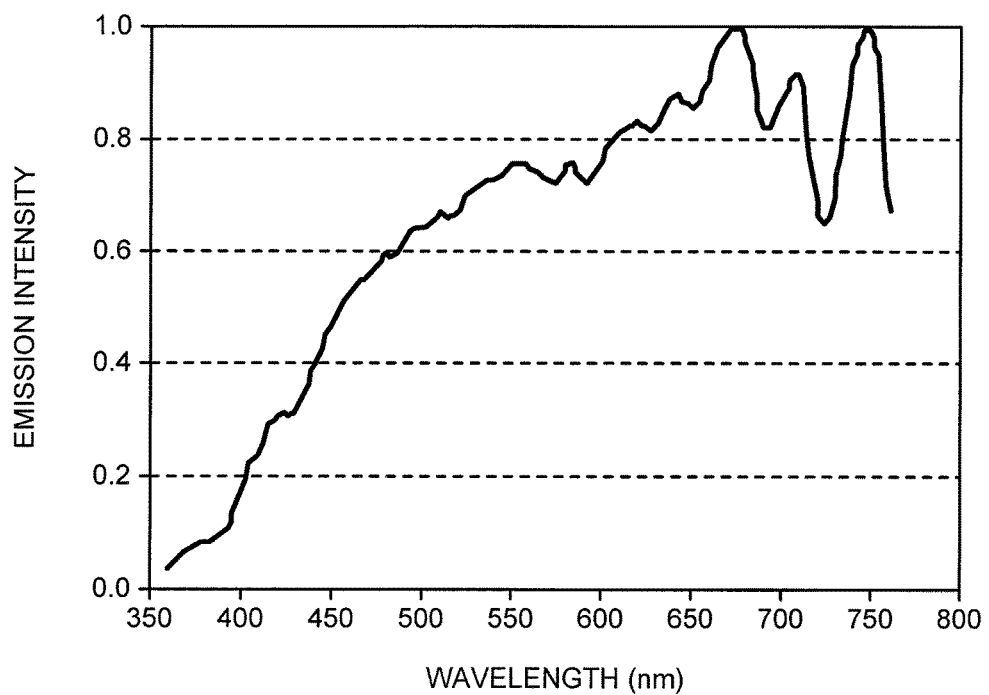
FIG. 24 is a chart illustrating an emission spectrum of sunlight at 17 o'clock on August 8 in Atami City.

White light at 17 o'clock on August 8 in Atami City was reproduced. As illustrated as a characteristic of this white light in FIG. 24, a color temperature was 4146 K+0.001 duv. In order to reproduce this white light, four LED modules including four types of white light sources were produced by using the same types of phosphors as the phosphors used in Example 1 and variously changing combination. Color temperatures of these four types of white light sources and mixing proportions of the respective light sources are presented as in Table 2.

Figure 25:
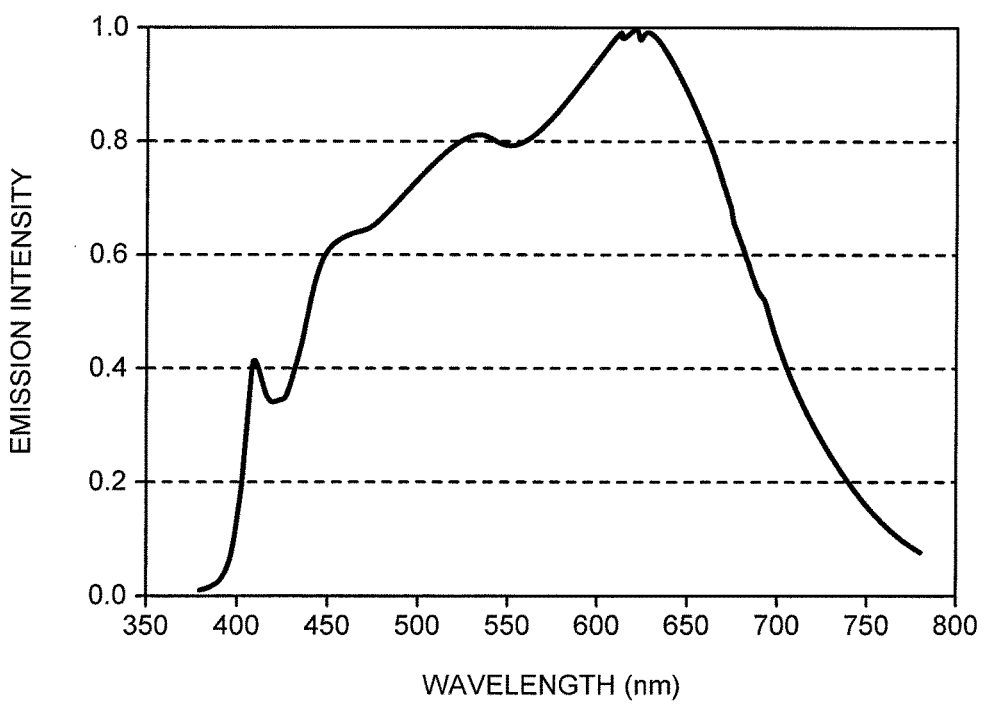
FIG. 25 is a chart illustrating an emission spectrum of a white light source system in Example 7.
Figure 26:
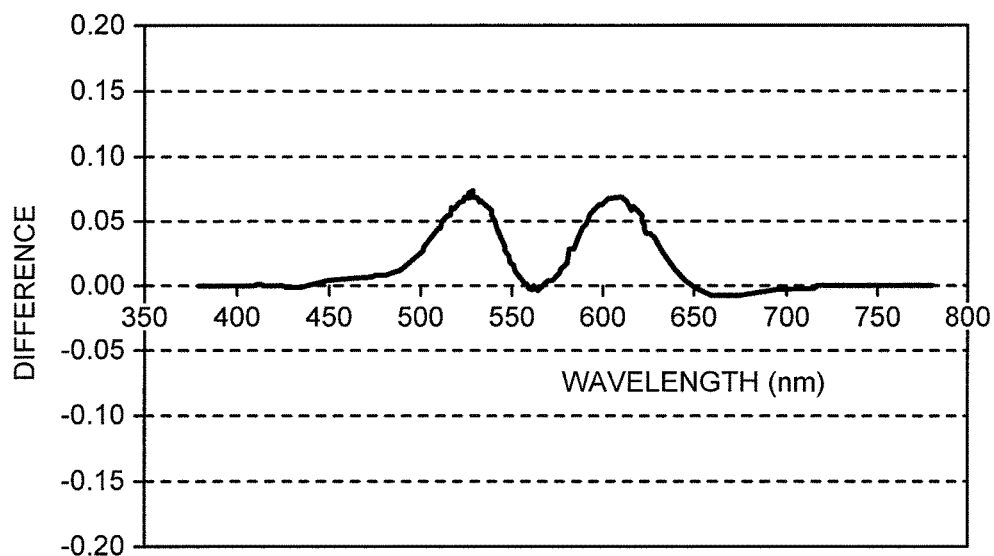
FIG. 26 is a chart illustrating a difference spectrum between a black body radiation spectrum having the same color temperature as that of the sunlight and the emission spectrum of a white light source in Example 7.

FIG. 25 illustrates an emission spectrum of the obtained white light source. As can be seen from the figure, an emission color of the white light source of this embodiment corresponds to an emission spectrum of sunlight well, and measurement of a difference between a black body radiation spectrum and the emission spectrum of the white light source was illustrated as in FIG. 26. It is found by a difference spectrum in the figure that this light source satisfies the following formula. Further, LED primary light leaked from this light source was 0.08 mW/1 m and very weak. Accordingly, the white light source in Example 7 is suitable as the art gallery lighting or the like similarly to Example 1.

$$-0.05 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.10$$

Example 8

Figure 27:
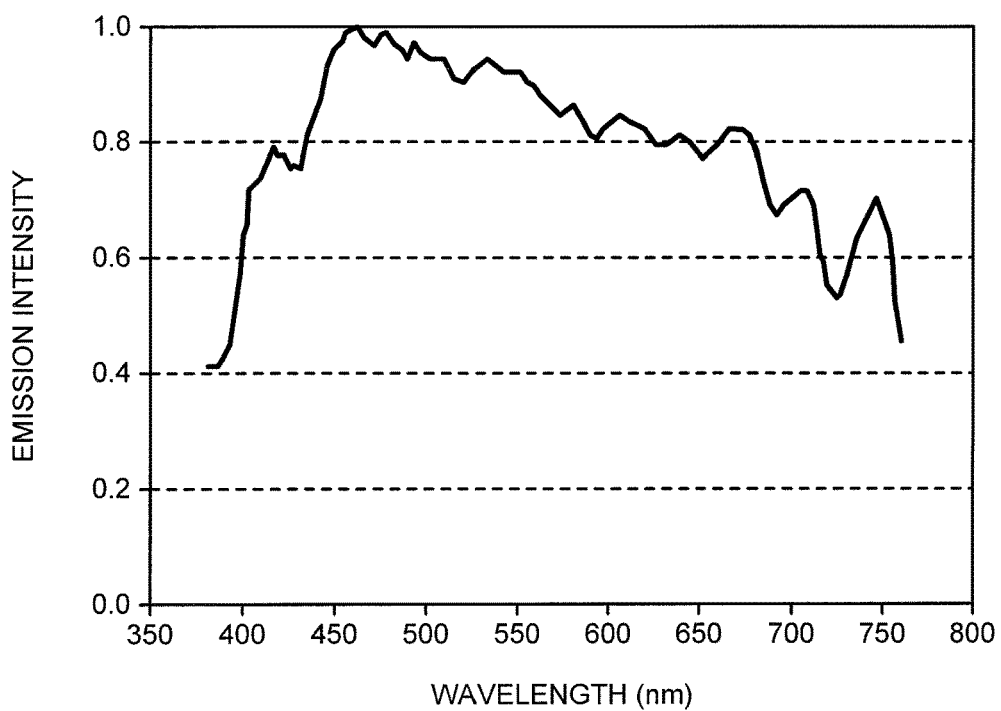
FIG. 27 is a chart illustrating an emission spectrum of sunlight at 12 o'clock on December 16 in Milan.

White light at 12 o'clock on December 16 in Milan was reproduced. As illustrated as a characteristic of this white light in FIG. 27, a color temperature was 5991 K+0.001 duv. In order to reproduce this white light, four LED modules including four types of white light sources were produced by using the same types of phosphors as the phosphors used in Example 1 and variously changing combination. Color temperatures of these four types of white light sources and mixing proportions of the respective light sources are presented as in Table 2.

Figure 28:
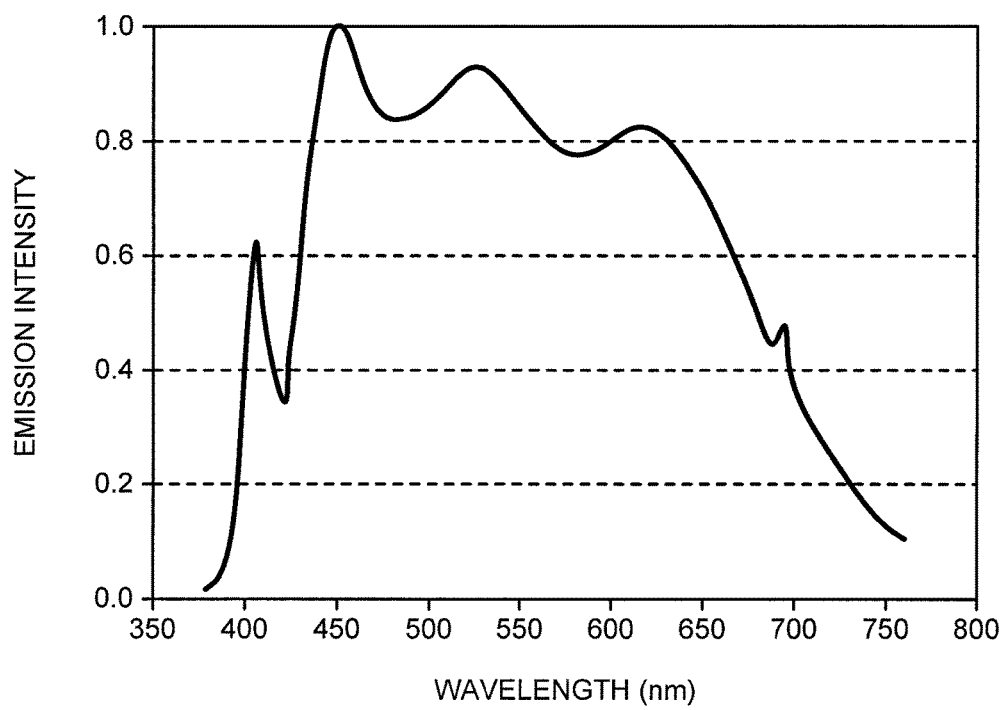
FIG. 28 is a chart illustrating an emission spectrum of a white light source system in Example 8.
Figure 29:
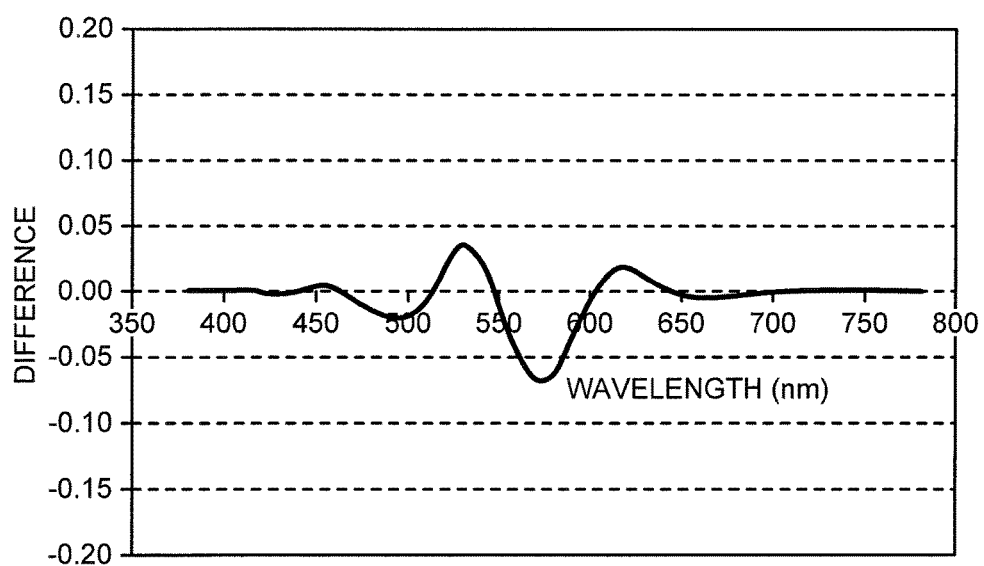
FIG. 29 is a chart illustrating a difference spectrum between a black body radiation spectrum having the same color temperature as that of the sunlight and the emission spectrum of a white light source in Example 8.

FIG. 28 illustrates an emission spectrum of the obtained white light source. As can be seen from the figure, an emission color of the white light source of this embodiment corresponds to an emission spectrum of sunlight well, and measurement of a difference between a black body radiation spectrum and the emission spectrum of the white light source was illustrated as in FIG. 29. It is found by a difference spectrum in the figure that this light source satisfies the following formula. Further, LED primary light leaked from this light source was 0.08 mW/1 m and very weak. Accordingly, the white light source in Example 8 is suitable as the art gallery lighting or the like similarly to Example 1.

$$-0.07 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.03$$

Example 9

Figure 30:
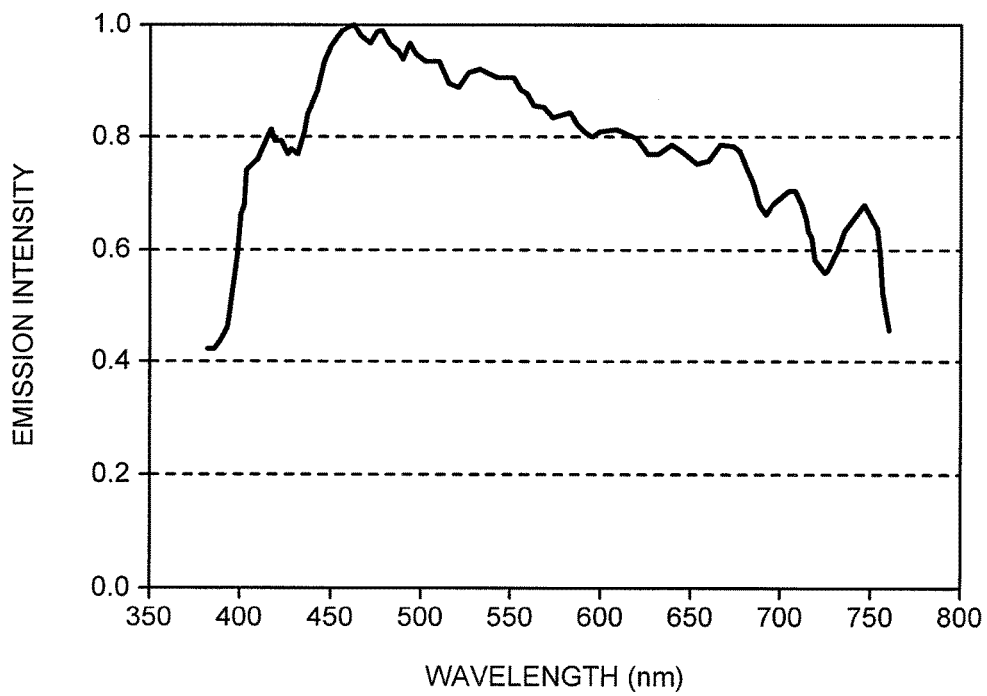
FIG. 30 is a chart illustrating an emission spectrum of sunlight at 12 o'clock on December 14 in Florence.

White light at 12 o'clock on December 14 in Florence was reproduced. As illustrated as a characteristic of this white light in FIG. 30, a color temperature was 6160 K+0.000 duv. In order to reproduce this white light, four LED modules including four types of white light sources were produced by using the same types of phosphors as the phosphors used in Example 1 and variously changing combination. Color temperatures of these four types of white light sources and mixing proportions of the respective light sources are presented as in Table 2.

Figure 31:
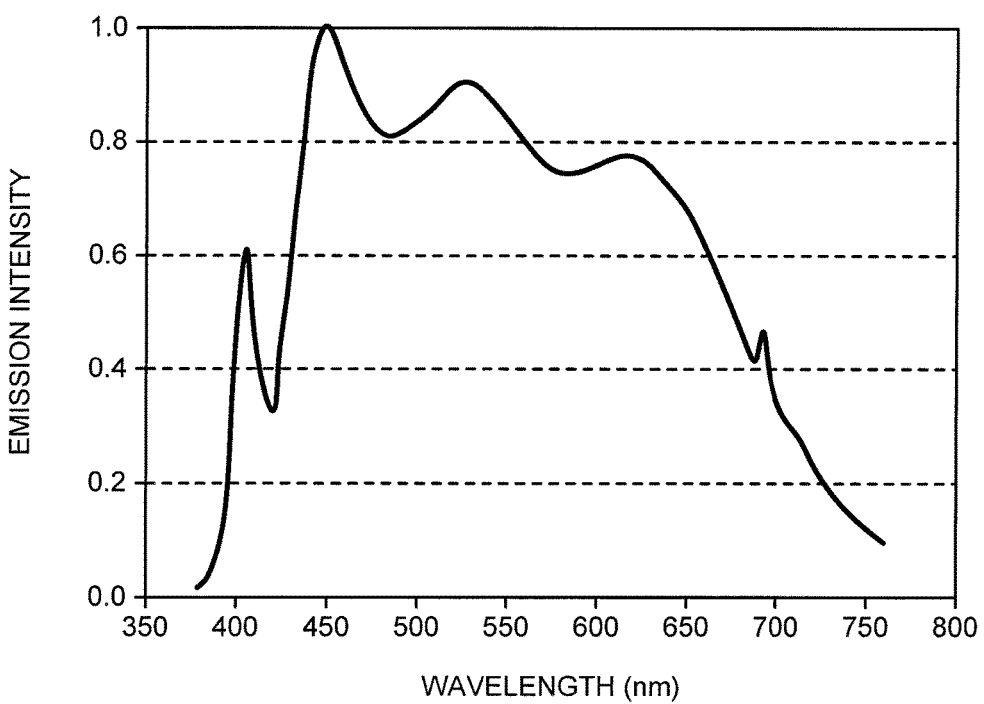
FIG. 31 is a chart illustrating an emission spectrum of a white light source system in Example 9.
Figure 32:
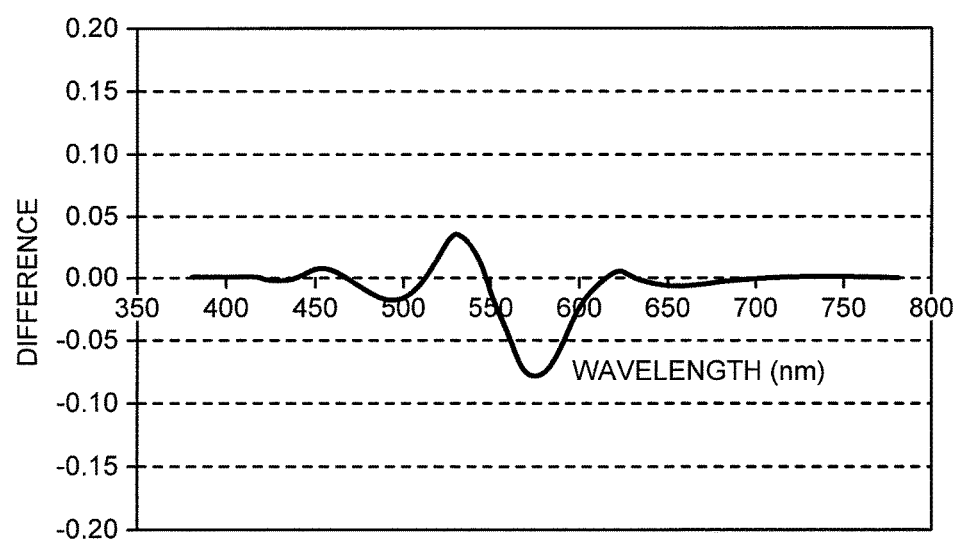
FIG. 32 is a chart illustrating a difference spectrum between a black body radiation spectrum having the same color temperature as that of the sunlight and the emission spectrum of a white light source in Example 9.

FIG. 31 illustrates an emission spectrum of the obtained white light source. As can be seen from the figure, an emission color of the white light source of this embodiment corresponds to an emission spectrum of sunlight well, and measurement of a difference between a black body radiation spectrum and the emission spectrum of the white light source was illustrated as in FIG. 32. It is found by a difference spectrum in the figure that this light source satisfies the following formula. Further, LED primary light leaked from this light source was 0.09 mW/1 m and very weak. Accordingly, the white light source in Example 9 is suitable as the art gallery lighting or the like similarly to Example 1.

$$-0.08 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.03$$

TABLE 2

|  | 1 | | 2 | | 3 | | 4 | |
| --- | --- | --- | --- | --- | --- | --- | --- | --- |
|  | Color Temperature | Mixing Intensity (Relative Value) | Color Temperature | Mixing Intensity (Relative Value) | Color Temperature | Mixing Intensity (Relative Value) | Color Temperature | Mixing Intensity (Relative Value) |
| Example 1 | 6320 K + 0.005 duv | 100 | 6490 K − 0.002 duv | 90 | 2610 K + 0.005 duv | 70 | 3050 K − 0.005 duv | 50 |
| Example 2 | 5550 K + 0.003 duv | 100 | 6010 K − 0.003 duv | 80 | 2930 K + 0.004 duv | 85 | 3050 K − 0.006 duv | 80 |
| Example 3 | 6010 K + 0.005 duv | 60 | 5840 K − 0.004 duv | 70 | 2880 K + 0.003 duv | 100 | 3050 K − 0.007 duv | 90 |
| Example 4 | 5880 K + 0.004 duv | 55 | 5310 K − 0.002 duv | 65 | 2650 K + 0.004 duv | 100 | 3050 K − 0.008 duv | 95 |
| Example 5 | 6490 K + 0.005 duv | 100 | 6770 K − 0.005 duv | 95 | 3050 K + 0.003 duv | 25 | 3050 K − 0.009 duv | 30 |
| Example 6 | 6380 K + 0.004 duv | 100 | 6250 K − 0.003 duv | 90 | 2770 K + 0.004 duv | 85 | 3050 K − 0.010 duv | 80 |
| Example 7 | 5020 K + 0.003 duv | 100 | 6100 K − 0.004 duv | 85 | 2700 K + 0.003 duv | 70 | 3050 K − 0.011 duv | 65 |
| Example 8 | 6320 K + 0.005 duv | 80 | 6490 K − 0.002 duv | 100 | 3050 K + 0.003 duv | 20 | 3620 K − 0.005 duv | 20 |
| Example 9 | 6320 K + 0.005 duv | 90 | 6490 K − 0.002 duv | 100 | 3050 K + 0.003 duv | 15 | 3620 K − 0.005 duv | 20 |

What is claimed is:

1. A white light source configured to reproduce at least a part of an emission spectrum of sunlight having a characteristic corresponding to an observation location, an observation date, and an observation time, the white light source comprising:

a light source unit to emit white light having a correlated color temperature corresponding to a chromaticity point on a CIE chromaticity diagram, the chromaticity point having a deviation of −0.005 or more to +0.005 or less with respect to a black body radiation locus, and the white light satisfying a formula: $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$, wherein $P(\lambda)$ represents an emission spectrum of the white light, $B(\lambda)$ represents a spectrum of black body radiation having a color temperature corresponding to the correlated color temperature of the white light, $V(\lambda)$ represents a spectrum of spectral luminous efficiency, $\lambda max1$ represents a wavelength in which $P(\lambda) \times V(\lambda)$ is a maximum value, and $\lambda max2$ represents a wavelength in which $B(\lambda) \times V(\lambda)$ is a maximum value.

2. The white light source according to claim 1, wherein the correlated color temperature is 2600 K or more to 6500 K or less.

3. The white light source according to claim 1, wherein the light source unit has a light emitting diode including:
a light emitting diode chip; and
a phosphor layer including at least three or more phosphors selected from the group consisting of a blue phosphor, a blue-green phosphor, a green phosphor, a yellow phosphor, and a red phosphor and a resin mixed with the phosphors, and covering the light emitting diode chip.

4. The white light source according to claim 3, wherein the phosphor layer includes the blue phosphor in an amount of 85 mass % or more and 94 mass % or less, the green phosphor in an amount of 2 mass % or more and 3 mass % or less, the yellow phosphor in an amount of 2 mass % or more and 4 mass % or less, and the red phosphor in an amount of 2 mass % or more and 8 mass % or less, and wherein a total amount of the phosphors is 100 mass %.

5. The white light source according to claim 3, wherein the blue phosphor includes a europium-activated alkaline-earth chlorophosphate phosphor or a europium-activated barium magnesium aluminate phosphor,
wherein the blue-green phosphor includes a europium-activated strontium aluminate phosphor or a europium-manganese activated barium magnesium aluminate phosphor,
wherein the green phosphor includes a europium-activated orthosilicate phosphor, a europium-activated beta-sialon phosphor, or a europium-activated strontium sialon phosphor,
wherein the yellow phosphor includes a europium-activated orthosilicate phosphor or a cerium-activated rare-earth aluminum garnet phosphor, and wherein the red phosphor includes a europium-activated strontium sialon phosphor, a europium-activated calcium nitridoaluminosilicate phosphor, a europium-activated lanthanum oxysulfide phosphor, or a manganese-activated magnesium fluorogermanate phosphor.

6. The white light source according to claim 3, wherein the phosphors are configured to absorb at least part of ultraviolet to violet primary light emitted from the light emitting diode chip and having a peak wavelength of 360 nm or more to 420 nm or less and thus convert absorbed primary light into white secondary light emitted outside the white light source, and
wherein a light emission energy of the primary light which is emitted from the white light source is 0.4 mW/1 m or less.

7. The white light source according to claim 3, wherein the resin has a silicone resin.

8. The white light source according to claim 3, wherein the light emitting diode further includes an ultraviolet absorbing film provided on an outer side of the phosphor layer and containing at least one material selected from the group consisting of zinc oxide, titanium oxide, and aluminum oxide.

9. The white light source according to claim 3, wherein a thickness of the phosphor layer is 100 m or more to 1000 m or less.

10. The white light source according to claim 3, wherein an average particle size of the phosphors is 10 μm or more to 40 μm or less.

11. A white light source system comprising:
a light emitter including
a first light emitting diode module to emit a first white light having a first correlated color temperature,
a second light emitting diode module to emit a second white light having the first correlated color temperature,
a third light emitting diode module to emit a third white light having a second correlated color temperature higher than the first correlated color temperature, and
a fourth light emitting diode module to emit a fourth white light having the second correlated color temperature; and
a controller to control each emission intensity of the first to fourth light emitting diode modules,
wherein each of the first to the fourth light emitting diode modules includes the white light source according to claim 1,
wherein on a CIE chromaticity diagram, each of a deviation of a first chromaticity point of the first white light with respect to a black body radiation locus and a deviation of a third chromaticity point of the third white light with respect to the black body radiation locus is "0" (zero) or more to +0.005 or less, and each of a deviation of a second chromaticity point of the second white light with respect to the black body radiation locus and a deviation of a fourth chromaticity point of the fourth white light with respect to the black body radiation locus on the CIE chromaticity diagram is −0.005 or more to "0" (zero) or less, and
wherein the light emitter is configured to emit mixed light of the first to fourth white lights, the mixed light having a correlated color temperature corresponding to a chromaticity point on CIE chromaticity diagram, the chromaticity point having a deviation of −0.005 or more to +0.005 or less with respect to a black body radiation locus, the correlated color temperature being the first correlated color temperature or more and the second correlated color temperature or less.

12. The white light source system according to claim 11, wherein the first correlated color temperature is 2600 K or more to 4000 K or less and the second correlated color temperature is 4000 K or more to 6500 K or less.

13. The white light source system according to claim 11, wherein the first correlated color temperature is 2600 K or more to less than 4000 K, and wherein the second correlated color temperature is 5000K or more to 6500 K or less.

14. The white light source system according to claim 11, wherein the controller includes:
a data input/output unit to receive data corresponding to the observation location, the observation time, and the observation date, wherein the observation location data indicates one of a plurality of regions on the earth;
a memory to store a plurality of first data, a plurality of second data, and a plurality of third data, the plurality of first data indicating emission spectra of sunlight in the regions, the plurality of second data indicating correlated color temperatures of the sunlight in the regions, and the plurality of third data indicating deviations of chromaticity points of the sunlight in the regions on a CIE chromaticity diagram with respect to a black body radiation locus, and wherein the plurality of first to third data are classified for each date and for each time;
a microprocessor to read the first to third data corresponding to the location data and the time data from the memory and calculate a mixing intensity proportion of each of the first to forth LED modules in accordance with the read first to third data; and
a circuit to control an amount of current supplied to each of the first to the fourth LED modules in accordance with the mixing intensity proportion.

15. The white light source system according to claim 11, wherein the white light source system is used for illuminating a showpiece in an art gallery or a museum.

16. The white light source according to claim 1, wherein the observation location is one of a plurality of regions on the earth.

17. The white light source according to claim 1, wherein the characteristic includes a color temperature.

18. The white light source according to claim 1, wherein the white light satisfies a formula: $-0.1 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.1$.

* * * * *